(12) United States Patent
Imai

(10) Patent No.: US 9,966,323 B2
(45) Date of Patent: May 8, 2018

(54) SEMICONDUCTOR DEVICE

(71) Applicant: SHINKO ELECTRIC INDUSTRIES CO., LTD., Nagano-Shi, Nagano-Ken (JP)

(72) Inventor: Hitomi Imai, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days. days.

(21) Appl. No.: 15/454,421

(22) Filed: Mar. 9, 2017

(65) Prior Publication Data

US 2017/0271233 A1 Sep. 21, 2017

(30) Foreign Application Priority Data

Mar. 18, 2016 (JP) .................................. 2016-055791

(51) Int. Cl.
| H01L 23/367 | (2006.01) |
| H01L 23/29 | (2006.01) |
| H01L 23/31 | (2006.01) |
| H01L 23/498 | (2006.01) |
| H01L 23/00 | (2006.01) |

(52) U.S. Cl.
CPC ........ *H01L 23/3675* (2013.01); *H01L 23/293* (2013.01); *H01L 23/3128* (2013.01); *H01L 23/49838* (2013.01); *H01L 24/09* (2013.01); H01L 2224/0401 (2013.01); H01L 2224/0603 (2013.01); H01L 2224/06051 (2013.01)

(58) Field of Classification Search
CPC combination set(s) only.
See application file for complete search history.

(56) References Cited

U.S. PATENT DOCUMENTS

| 6,894,384 B1 * | 5/2005 | Shizuno | ................. | H01L 23/24 257/712 |
| 8,975,741 B2 * | 3/2015 | Lin | ...................... | H01L 21/568 257/700 |
| 9,653,445 B2 * | 5/2017 | Lin | ......................... | H01L 22/20 |
| 9,748,177 B2 * | 8/2017 | Teh | ..................... | H01L 23/5389 |
| 9,773,763 B2 * | 9/2017 | Imai | ................. | H01L 23/49811 |

(Continued)

FOREIGN PATENT DOCUMENTS

JP     2006-210870 A     8/2006

*Primary Examiner* — Mamadou Diallo
(74) *Attorney, Agent, or Firm* — Tarolli, Sundheim, Covell & Tummino LLP

(57) ABSTRACT

A semiconductor device includes an electronic component connected to a component pad of a wiring substrate, a connection member connected to a connection pad of the wiring substrate, and an encapsulation resin that encapsulates the electronic component and connection member. A wiring unit includes a first pad, embedded in the encapsulation resin, and a second pad, formed integrally with the first pad from the same metal. The second pad includes an external device connection surface located at a higher position than an upper surface of the encapsulation resin. A reinforcement plate includes a base, embedded in the encapsulation resin, and a heat dissipation portion, formed integrally with the base from the same metal. The first pad and the base each include a curved side surface that widens outwardly toward the upper surface of the encapsulation resin.

8 Claims, 13 Drawing Sheets

(56) References Cited

U.S. PATENT DOCUMENTS

2005/0212148 A1* 9/2005 Otani .................. H01L 23/3128
257/787
2006/0022320 A1* 2/2006 Nakanishi ........... H01L 23/3114
257/678

* cited by examiner

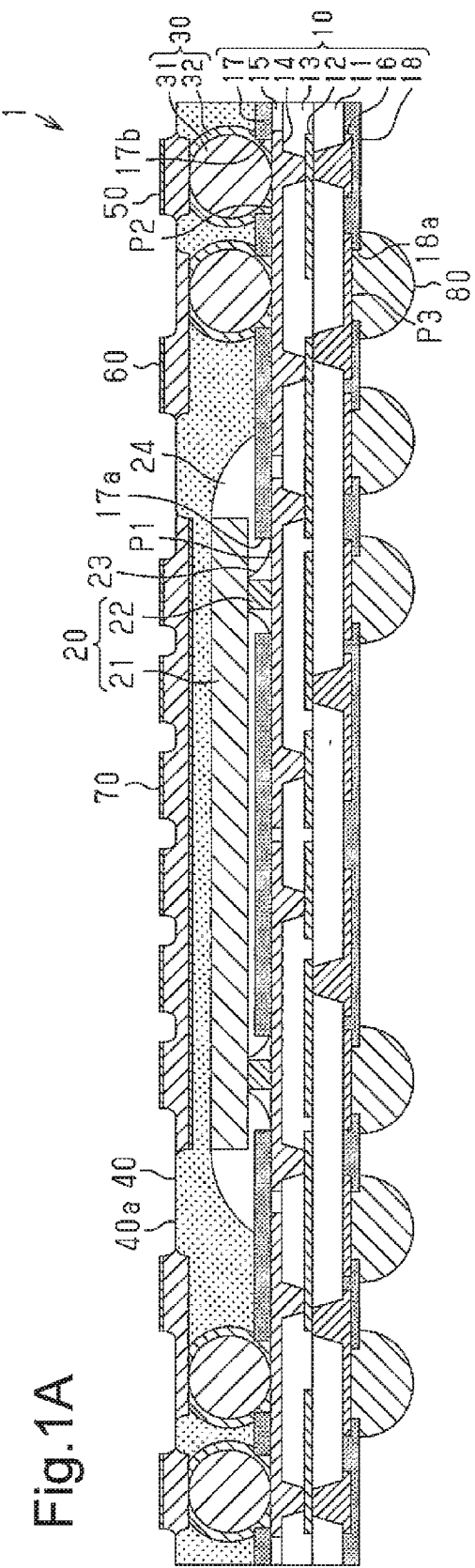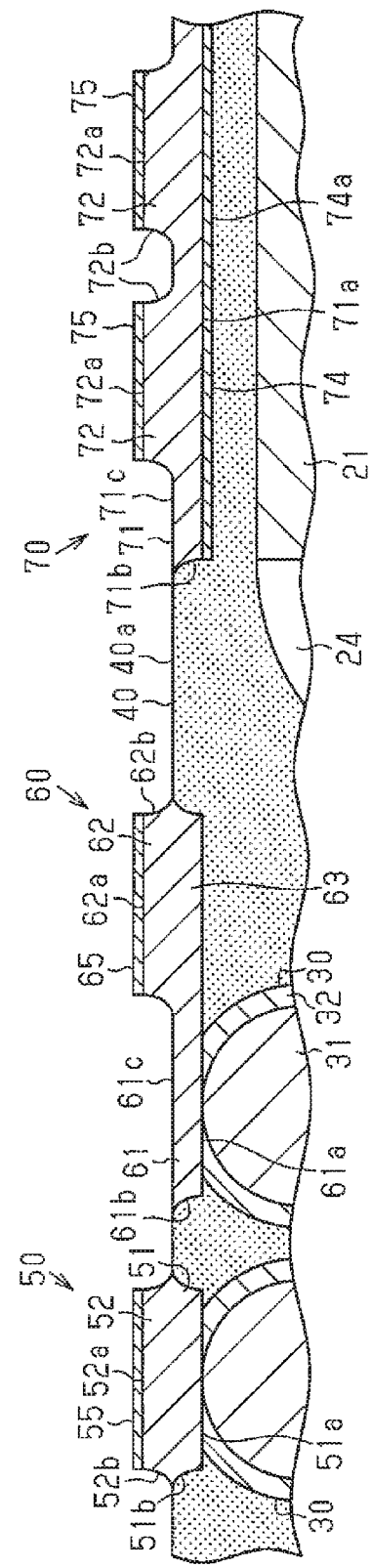
Fig.1A
Fig.1B

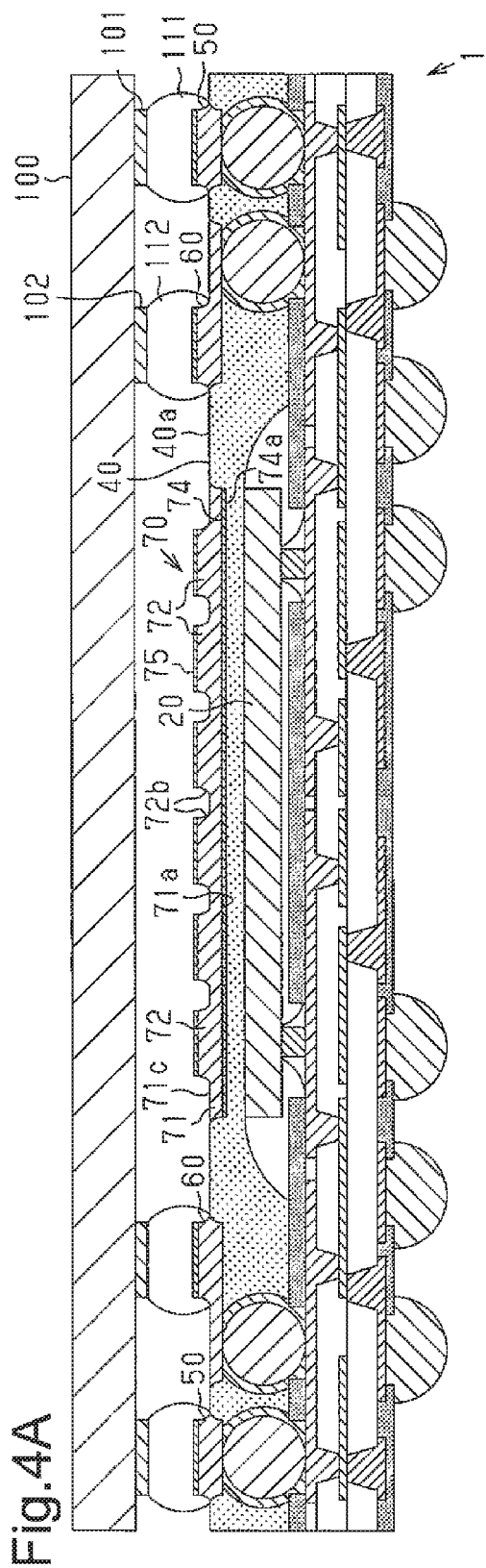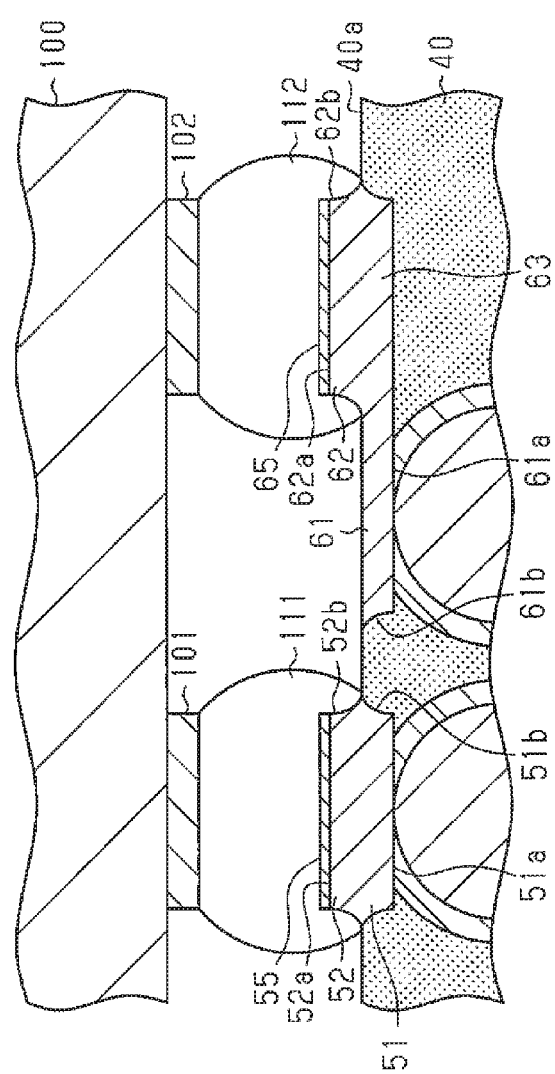

SEMICONDUCTOR DEVICE

CROSS-REFERENCE TO RELATED APPLICATIONS

This application is based upon and claims the benefit of priority from prior Japanese Patent Application No. 2016-055791, filed on Mar. 18, 2016, the entire contents of which are incorporated herein by reference.

FIELD

This disclosure relates to a semiconductor device and a method for manufacturing a semiconductor device.

BACKGROUND

Semiconductor devices including semiconductor chips need to be increased in density and reduced in size. Japanese Laid-Open Patent Publication No. 2006-210870 describes an example of semiconductor-chip-embedded wiring substrates that are used in a semiconductor device. Such semiconductor-chip-embedded wiring substrates are stacked to increase the density of a semiconductor device.

SUMMARY

It is desired that a semiconductor device including an electronic component such as a semiconductor chip be reduced in thickness.

One embodiment of this disclosure is a semiconductor device including a wiring substrate, an electronic component, a conductive connection member, an encapsulation resin, a wiring unit, and a reinforcement plate. The wiring substrate includes an upper surface on which a component pad and a connection pad are formed. The electronic component is connected to the component pad. The connection member is connected to the connection pad. The encapsulation resin encapsulates the electronic component and the connection member and covers the upper surface of the wiring substrate. The wiring unit includes a first pad and a second pad. The first pad is embedded in the encapsulation resin and electrically connected to the connection member, and the second pad includes an external device connection surface located at a higher position than an upper surface of the encapsulation resin. The reinforcement plate includes a base and a heat dissipation portion. The base is plate-like and embedded in the encapsulation resin, and the heat dissipation portion includes an upper surface located at a higher position than the upper surface of the encapsulation resin. The first pad and the second pad are formed integrally from the same metal. The base and the heat dissipation portion are formed integrally from the same metal. The first pad and the base each include a side surface that is curved so that the curved side surface widens outwardly toward the upper surface of the encapsulation resin.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view of a semiconductor device;

FIG. 1B is a partially, enlarged cross-sectional view of the semiconductor device illustrated in FIG. 1A;

FIG. 4A is a schematic cross-sectional view illustrating the semiconductor device of FIG. 1A and another semiconductor device formed thereon;

FIG. 4B is a partially, enlarged cross-sectional view of FIG. 4A;

DESCRIPTION OF THE EMBODIMENTS

Figure 2:
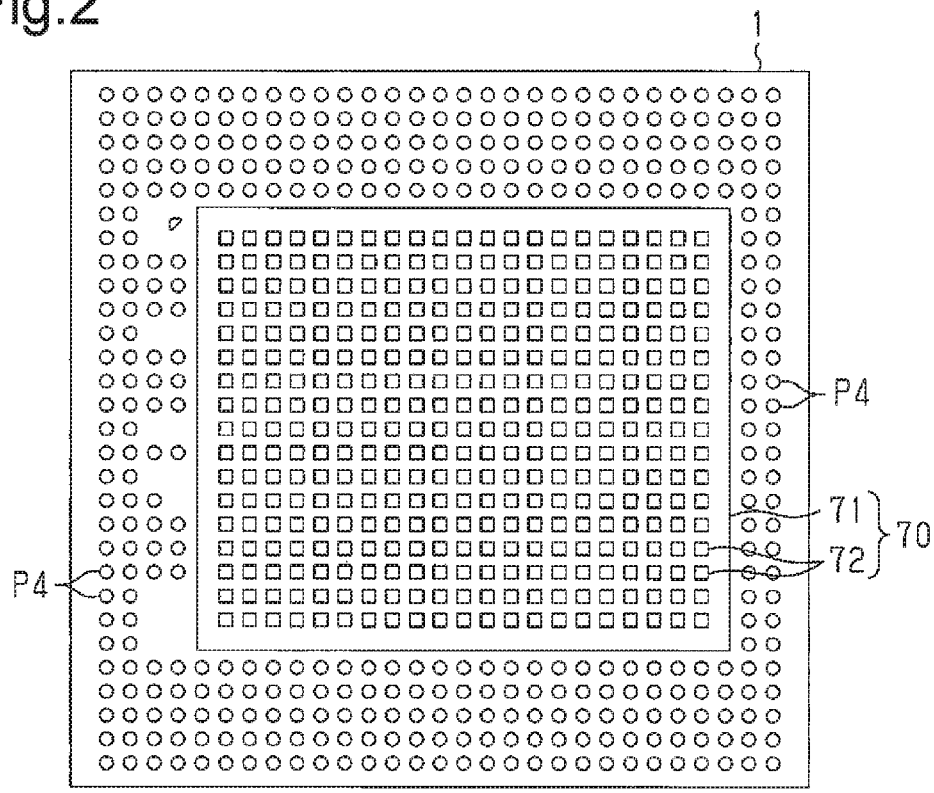
FIG. 2 is a schematic plan view of the semiconductor device illustrated in FIG. 1A.

One embodiment will now be described with reference to the accompanying drawings. In the drawings, elements are illustrated for simplicity and clarity and have not necessarily been drawn to scale. To facilitate understanding, hatching lines may not be shown or be replaced by shadings in the cross-sectional drawings.

As illustrated in FIG. 1A, a semiconductor device 1 includes a wiring substrate 10, a semiconductor chip 20, connection members 30, an encapsulation resin 40, wiring units 50 and 60, a reinforcement plate 70, and bumps 80.

The semiconductor chip 20 and the connection members 30 are mounted on an upper surface of the wiring substrate 10. The bumps 80 are formed on a lower surface of the wiring substrate 10. The semiconductor chip 20 and the connection members 30 are encapsulated in the encapsulation resin 40. The wiring units 50 and 60 and the reinforcement plate 70 are arranged on an upper surface 40a of the encapsulation resin 40. The connection members 30 electrically connect the wiring units 50 and 60 to the wiring substrate 10.

The wiring substrate 10 includes an insulation layer 11, a wiring layer 12, an insulation layer 13, a wiring layer 14, an insulation layer 15, a wiring layer 16, a protective insulation layer 17, and a solder resist layer 18.

In the wiring substrate 10, the material of the insulation layer 11 may be, for example, a glass epoxy resin obtained by impregnating a glass cloth (glass woven cloth), which is a reinforcement material, with a thermosetting insulative resin, the main component of which is an epoxy resin, and hardening the thermosetting insulative resin. The reinforcement material is not limited to glass cloth. Examples of reinforcement materials that may be used include glass non-woven cloth, aramid woven cloth, aramid non-woven cloth, liquid crystal polymer (LCP) woven cloth, or LCP non-woven cloth. The thermosetting insulative resin is not limited to an epoxy resin and may be, for example, a resin material such as a polyimide resin or a cyanate resin.

The wiring layer 12, the insulation layer 13, the wiring layer 14, and the insulation layer 15 are sequentially formed on an upper surface of the insulation layer 11. The wiring layer 16 is formed on a lower surface of the insulation layer 11. The wiring layer 12 is formed on the upper surface of the insulation layer 11. The insulation layer 13 is formed on the upper surface of the insulation layer 11 and covers the wiring layer 12. The wiring layer 14 is formed on an upper surface of the insulation layer 13. The wiring layer 14 includes a via wiring, which extends through the insulation layer 13 in a thickness-wise direction, and a wiring pattern, which is electrically connected by the via wiring to the wiring layer 12 and formed on the upper surface of the insulation layer 13. The insulation layer 15 is formed on the upper surface of the insulation layer 13. The insulation layer 15 is formed at the outer side of the wiring layer 14. In other words, the wiring layer 14 is embedded in the insulation layer 15. The wiring layer 16 includes a via wiring, which extends through the insulation layer 11 in the thickness-wise direction, and a wiring pattern, which is electrically connected by the via wiring to the wiring layer 12 and formed on the lower surface of the insulation layer 11.

The material of the insulation layers 13 and 15 may be, for example, an insulative resin, such as an epoxy resin or a polyimide resin, or a resin material obtained by mixing a filler of silica or alumina in these insulative resins. The material of the wiring layers 12, 14, and 16 may be, for example, copper (Cu) or a copper alloy.

The protective insulation layer 17 covers the insulation layer 15 and portions of the wiring layer 14. The protective insulation layer 17 includes openings 17a, from which portions in an upper surface of the wiring layer 14 are exposed as component pads P1, and openings 17b, from which portions in the upper surface of the wiring layer 14 are exposed as connection pads P2. That is, the wiring substrate 10 includes the component pads P1 and the connection pads P2 that are formed on the upper surface of the wiring layer 14. The solder resist layer 18 covers the insulation layer 11 and portions of the wiring layer 16. The solder resist layer 18 includes openings 18a from which portions in a lower surface of the wiring layer 16 are exposed as external connection pads P3.

The material of the protective insulation layer 17 may be, for example, an insulative resin such as an epoxy resin or an acrylic resin. The openings 17a and 17b in the protective insulation layer 17 have diameters set in accordance with the members that are connected to the pads P1 and P2. The material of the solder resist layer 18 may be, for example, an insulative resin such as an epoxy resin or an acrylic resin. The openings 18a in the solder resist layer 18 have diameters set in accordance with the members that are connected to the pads P3.

When necessary, a surface-processed layer may be formed on the surface of the wiring layer 14 exposed from the openings 17a and 17b. Examples of the surface-processed layer include a gold (Au) layer, a nickel (Ni) layer/Au layer (metal layer in which Ni layer is bottom layer, and Au layer is formed on Ni layer), Ni layer/palladium (Pd) layer/Au layer (metal layer in which Ni layer, Pd layer, and Au layer are stacked in this order, with Ni layer serving as the bottom layer). The Au layer, the Ni layer, and the Pd layer may be, for example, electroless plating metal layers formed through electroless plating. The Au layer is a metal layer formed from Au or a Au alloy, the Ni layer is a metal layer formed form Ni or a Ni alloy, and the Pd layer is a metal layer formed from Pd or a Pd alloy. Alternatively, the surface-processed layer may be formed by performing an anti-oxidation process such as an Organic Solderability Preservative (OSP) process on the upper surface of the wiring layer 14. When performing, for example, the OSP process, an organic coating such as that of an azole compound or an imidazole compound is formed as the surface-processed layer on the surface of the wiring layer 14 (component pads P1 and connection pads P2). The portions of the wiring layer 14 exposed by the openings 17a and 17b may be used as external connection terminals. Instead, the surface-processed layer formed on the wiring layer 14 may be used as external connection terminals. In the same manner, a surface-processed layer may be formed on portions of the wiring layer 16 exposed from the openings 18a.

The semiconductor chip 20 is mounted on the component pads P1. The semiconductor chip 20 is flip-chip-mounted on the wiring substrate 10 in a face-down state (circuit-formation surface of semiconductor chip 20 opposed to upper surface of wiring substrate 10). The semiconductor chip 20 includes a chip body 21, which is provided with a semiconductor integrated circuit, and projected electrodes 22, which serve as connection terminals. The projected electrodes 22 are electrically connected by joining members 23 to the component pads P1. The projected electrodes 22 may be, for example, gold bumps or copper posts. The joining members 23 may be formed from, for example, a solder material such as an alloy including lead (Pb), an alloy of tin (Sn) and copper (Cu), an alloy of Sn and Sb, an alloy of Sn and silver (Ag), or an alloy of Sn, Ag, and Cu.

The semiconductor chip 20 may be, for example, a logic chip such as a Central Processing Unit (CPU) chip or a Graphics Processing Unit (GPU) chip. Further, the semiconductor chip 20 may be, for example, a memory chip such as a Dynamic Random Access Memory (DRAM) chip, a Static Random Access Memory (SRAM) chip, or a flash memory chip. When multiple semiconductor chips are mounted on the wiring substrate 10, a logic chip and a memory chip may be combined.

The semiconductor chip 20 is one example of an electronic component mounted on the wiring substrate 10. The electronic component may be a passive element such as a capacitor, an inductor, or a resistor. Further, the electronic component may be a semiconductor package including a semiconductor chip such as a chip size package (CSP). A combination of a passive element and a semiconductor package may be mounted on the wiring substrate 10.

A gap between the semiconductor chip 20 and the wiring substrate 10 is filled with an underfill resin 24. The underfill resin 24 also extends along each side surface of the semiconductor chip 20. The underfill resin 24 continuously covers the circuit formation surface and side surfaces of the semiconductor chip 20. The semiconductor chip 20 includes an upper surface (surface opposite to circuit formation surface) that is exposed from the underfill resin 24. The material of the underfill resin 24 may be, for example, an insulative resin such as an epoxy resin or an acrylic resin.

The connection members 30 are connected to the connection pads P2. The connection members 30 are, for example, cored solder balls. Each connection member 30 includes a spherical core 31 and a conductive material 32, which coats the outer surface of the core 31. The cores 31 of the connection members 30 are in contact with the connection pads P2.

The core 31 may be, for example, a metal core. The material of the metal core may be, for example, copper, gold (Au), or nickel (Ni). The core 31 may also be a resin core formed from a resin. The conductive material 32 may be, for example, a solder material such as an alloy including lead (Pb), an alloy of Sn and Cu, an alloy of Sn and Sb, an alloy of Sn and Ag, or an alloy of Sn, Ag, and Cu. The core 31 has a diameter determined in accordance with the height (thickness) of the semiconductor chip 20.

In FIGS. 1A and 1B, the connection members 30 are illustrated in a simplified manner. The connection members 30 are, for example, arranged in lines along the periphery of the wiring substrate 10. When the wiring substrate 10 is rectangular in a plan view, the connection members 30 are arranged along the periphery of the wiring substrate 10.

The encapsulation resin 40 encapsulates the semiconductor chip 20, the underfill resin 24, and the connection members 30. The material of the encapsulation resin 40 may be, for example, an insulative resin such as a thermosetting epoxy resin that contains a filler.

As illustrated in FIG. 1B, the wiring units 50 and 60 are arranged on the upper surface 40a of the encapsulation resin 40. The wiring unit 50 includes a lower pad 51 and an upper pad 52. The lower pad 51 and the upper pad 52 are formed integrally with each other. The material of the wiring unit 50 may be, for example, copper or a copper alloy.

The lower pad 51 is embedded in the encapsulation resin 40. The lower pad 51 is connected to the connection members 30. The lower pad 51 includes a lower surface 51a that is in contact with the connection members 30. Accordingly, the connection members 30 electrically connect the wiring unit 50 to the connection pads P2 of the wiring substrate 10 illustrated in FIG. 1A. The lower pad 51 includes a side surface 51b that is in contact with the encapsulation resin 40.

The upper pad 52 projects from the upper surface 40a of the encapsulation resin 40. Accordingly, an upper surface 52a of the upper pad 52 is located at a higher position than the upper surface 40a of the encapsulation resin 40. A surface-processed layer 55 is formed on the upper surface 52a of the upper pad 52. The surface-processed layer 55 is, for example, a gold (Au) layer. The Au layer is a metal layer of Au or a Au alloy. Examples of the surface-processed layer 55 include a nickel (Ni) layer/Au layer (metal layer in which Ni layer is bottom layer, and Au layer is formed on Ni layer), Ni layer/palladium (Pd) layer/Au layer (metal layer in which Ni layer, Pd layer, and Au layer are stacked in this order, with Ni layer serving as the bottom layer). The Ni layer is a metal layer of Ni or a Ni alloy, and the Pd layer is a metal layer of Pd or a Pd alloy.

The side surface 51b of the lower pad 51 is curved so that the curved side surface 51b widens outwardly toward the upper surface 40a of the encapsulation resin 40. Thus, the lower pad 51 has a cross-sectional area in a plan view that increases from the lower surface 51a of the lower pad 51 toward the upper surface 40a of the encapsulation resin 40. Further, the side surface 51b of the lower pad 51 is recessed and curved inwardly into the lower pad 51 from the lower end to the upper end (upper surface 40a of encapsulation resin 40).

In the same manner, the upper pad 52 includes a side surface 52b that is curved so that the curved side surface 52b widens outwardly toward the upper surface 40a of the encapsulation resin 40. Thus, the upper pad 52 has a cross-sectional area in a plan view that increases from the upper surface 52a of the upper pad 52 toward the upper surface 40a of the encapsulation resin 40. Further, the side surface 52b of the upper pad 52 is recessed and curved inwardly into the upper pad 52 from the upper end to the lower end (upper surface 40a of encapsulation resin 40).

The wiring unit 60 includes a lower pad 61, an upper pad 62, and a connection portion 63. The lower pad 61, the upper pad 62, and the connection portion 63 are formed integrally with one another. The material of the wiring unit 60 may be, for example, copper or a copper alloy.

The lower pad 61 is formed in the same manner as the lower pad 51 of the wiring unit 50. That is, the lower pad 61 is embedded in the encapsulation resin 40. The lower pad 61 is in contact with and connected to the connection members 30. The connection members 30 electrically connect the lower pad 61 to the connection pads P2 of the wiring substrate 10 illustrated in FIG. 1A.

The upper pad 62 is formed in the same manner as the upper pad 52 of the wiring unit 50. The upper pad 62 projects from the upper surface 40a of the encapsulation resin 40. Accordingly, the upper pad 62 includes an upper surface 62a that is located at a higher position than the upper surface 40a of the encapsulation resin 40. A surface-processed layer 65 is formed on the upper surface 62a of the upper pad 62.

In the wiring unit 60, the lower pad 61 and the upper pad 62 are located at separate positions in a plan view. The lower pad 61 is located at a position corresponding to where the connection pads P2 of the wiring substrate 10 are located. The upper pad 62 is located at a position corresponding to where the pads are located in a further semiconductor device mounted on the semiconductor device 1. The connection portion 63 serves as a wiring that electrically connects the upper pad 62 and the lower pad 61. In the present embodiment, the connection portion 63 is embedded in the encapsulation resin 40 in the same manner as the lower pad 61. The connection portion 63 only needs to electrically connect the upper pad 62 and the lower pad 61 and may be partially or entirely projected from the upper surface 40a of the encapsulation resin 40.

The wiring unit 50 is applied when the connection pads P2 of the wiring substrate 10 are located at positions corresponding to where the pads of another semiconductor device are located. In this case, a portion of the lower pad 51 and a portion of the upper pad 52 function as a connection portion.

The lower pad 61 includes a side surface 61b that is curved so that the curved side surface 61b widens outwardly toward the upper surface 40a of the encapsulation resin 40. Thus, the lower pad 61 has a cross-sectional area in a plan view that increases from a lower surface 61a of the lower pad 61 toward the upper surface 40a of the encapsulation resin 40. Further, the side surface 61b of the lower pad 61 is recessed and curved inwardly into the lower pad 61 from the lower end to the upper end (upper surface 40a of encapsulation resin 40).

In the same manner, the upper pad 62 includes a side surface 62b that is curved so that the curved side surface 62b widens outwardly toward the upper surface 40a of the encapsulation resin 40. Thus, the upper pad 62 has a cross-sectional area in a plan view that increases from the upper surface 62a of the upper pad 62 toward the upper surface 40a of the encapsulation resin 40. Further, the side surface 62b of the upper pad 62 is recessed and curved inwardly into the upper pad 62 from the upper end to the lower end (upper surface 40a of encapsulation resin 40).

In the wiring units 50 and 60, the side surfaces 51b and 61b of the lower pads 51 and 61 are formed by a film of copper oxide. The copper oxide film has low solder wettability. In this manner, the side surfaces 51b and 61b of the wiring units 50 and 60 are formed by an oxide coating that lowers the solder wettability. Such an oxide film hinders the spreading of solder. In the wiring unit 60, the side surface and the lower surface of the connection portion 63 are also formed by an oxide coating such as a film of copper oxide. Further, in the wiring unit 60, an oxide film may be formed in the same manner on an upper surface 61c of the lower pad 61.

In the wiring units 50 and 60, an oxide coating is not formed on the portions that contact the connection members 30. Thus, the lower surfaces 51a and 61a of the lower pads 51 and 61 in the wiring units 50 and 60 have satisfactory solder wettability and are connected to the connection members 30 in a suitable manner. A flux action, which will be described later, may be used to remove oxide coatings from the portions of the wiring units 50 and 60 that contact the connection members 30. Further, a surface-processed layer may be formed on the lower surfaces 51a and 61a. The surface-processed layer may be similar to the surface-processed layers 55 and 65. The surface-processed layer improves the solder wettability. Thus, the surface-processed layer facilitates the connection of the lower pads 51 and 61 to the connection members 30.

Referring to FIG. 1A, the reinforcement plate 70 is arranged on the upper surface 40a of the encapsulation resin 40. The reinforcement plate 70 is located in the upper surface 40a of the encapsulation resin 40 above the semiconductor chip 20, which is encapsulated by the encapsulation resin 40.

Referring to FIG. 1B, the reinforcement plate 70 includes a base 71, heat dissipation portions 72, a rough-surface plating layer 74, and the surface-processed layer 75. Referring to FIG. 2, the base 71 is, for example, plate-like and rectangular in a plan view. Each heat dissipation portion 72 is, for example, rectangular (e.g., square) in a plan view. The base 71 is formed integrally with the heat dissipation portions 72. The material of the reinforcement plate 70 may be, for example, copper or a copper alloy. The reinforcement plate 70 is formed by, for example, a metal plate that forms each of the wiring units 50 and 60.

The base 71 is arranged in the same manner as the lower pads 51 of the wiring unit 50. That is, the base 71 is embedded in the encapsulation resin 40. In the present embodiment, the base 71 includes an upper surface 71c that is generally flush with the upper surface 40a of the encapsulation resin 40. Further, the base 71 includes a side surface 71b that is curved so that the curved side surface 71b widens outwardly toward the upper surface 40a of the encapsulation resin 40. This increases the cross-sectional area of the base 71 in a plan view from a lower surface 71a of the base 71 toward the upper surface 40a of the encapsulation resin 40. Further, the side surface 71b of the base 71 is recessed and curved inwardly into the base 71 from the lower end to the upper end (upper surface 40a of encapsulation resin 40).

The rough-surface plating layer 74 is formed on a lower surface 71a of the base 71. The rough-surface plating layer 74 includes a lower surface 74a that is roughened. The rough-surface plating layer 74 is formed from, for example, Cu, Ni, chromium (Cr), or, Fe. Alternatively, the rough-surface plating layer 74 may be formed from an alloy obtained by combining two or more of these elements or by a stacked body of two or more of these elements. The lower surface 74a (roughened surface) of the rough-surface plating layer 74 includes fine irregularities. The roughness of the lower surface 74a is set by adjusting the plating liquid composition or current density when performing electrolytic plating on the rough-surface plating layer 74.

The heat dissipation portions 72 are formed on the upper surface 71c of the base 71. Each heat dissipation portion 72 extends upward from the upper surface 71c of the base 71. As described above, the base 71 is embedded in the encapsulation resin 40, and the upper surface 71c of the base 71 is generally flush with the upper surface 40a of the encapsulation resin 40. Accordingly, each heat dissipation portion 72 includes an upper surface 72a that is located at a higher position than the upper surface 40a of the encapsulation resin 40. In the present embodiment, the upper surface 72a of each heat dissipation portion 72 is flush with the upper surfaces 52a and 62a of the upper pads 52 and 62 in the wiring units 50 and 60.

The surface-processed layer 75 is formed on the upper surfaces 72a of the heat dissipation portions 72. The surface-processed layer 75 is, for example, a gold (Au) layer. An Au layer is a metal layer formed from Au or an Au alloy. The surface-processed layer 75 may be a nickel (Ni) layer/Au layer (metal layer in which Ni layer is bottom layer, and Au layer is formed on Ni layer) or a Ni layer/palladium (Pd) layer/Au layer (metal layer in which Ni layer, Pd layer, and Au layer are stacked in this order, with Ni layer serving as the bottom layer). The Ni layer is a metal layer of Ni or a Ni alloy, and the Pd layer is a metal layer of Pd or a Pd alloy.

Each heat dissipation portion 72 includes a side surface 72b that is curved so that the curved side surface 72b widens outwardly toward the upper surface 71c of the base 71. This increases the cross-sectional area of the heat dissipation portion 72 in a plan view from the upper surface 72a of the heat dissipation portion 72 toward the base 71. Further, the side surface 72b of the heat dissipation portion 72 is recessed and curved inwardly into the heat dissipation portion 72 from the upper end toward the upper surface 71c of the base 71. In the same manner as the upper pads 52 of the wiring unit 50, the heat dissipation portions 72 including side surfaces that are curved and outwardly widened toward the upper surface 40a of the encapsulation resin 40 may be formed on the end of the base 71.

Referring to FIG. 2, the semiconductor device 1 is rectangular in a plan view. Lines of upper pads P4 are arranged along the periphery of the semiconductor device 1. Each upper pad P4 is the upper pad 52 or the upper pad 62 illustrated in FIG. 1A. The upper pads P4 illustrated in FIG. 2 differs in arrangement and number from the upper pads 52 and 62 illustrated in FIG. 1A. In the semiconductor device 1, the reinforcement plate 70 is arranged in a region located at the inner side of the upper pads P4 in a plan view.

In the present embodiment, the base 71 is rectangular in a plan view, and each heat dissipation portion 72 is also rectangular in a plan view. The heat dissipation portions 72 are in a matrix array.

Referring to FIG. 1A, the bumps 80 are formed on lower surfaces of the external connection pads P3. The bumps 80 are, for example, solder bumps serving as external connection terminals used to mount the semiconductor device 1, or the wiring substrate 10, onto other substrates (e.g., mounting substrate such as motherboard). The external connection terminals may be solder balls, lead pins, stud bumps, or the like.

The operation of the semiconductor device 1 will now be described.

As illustrated in FIG. 4A, the wiring units 50 and 60 of the semiconductor device 1 are connected to another semiconductor device 100 located above the semiconductor device 1. The semiconductor device 100 is one example of an external device connected to the semiconductor device 1.

The semiconductor device 100 is, for example, a semiconductor package including semiconductor chips such as a memory or a peripheral circuit. Connection pads 101 and 102 are formed on a lower surface of the semiconductor device 100. The connection pads 101 and 102 are respectively connected by solder 111 and solder 112 to the wiring units 50 and 60 of the semiconductor device 1. The solder 111 and the solder 112 are, for example, solder bumps formed on the connection pads 101 and 102 of the semiconductor device 100. The solder bumps may be formed by, for example, mounting micro-balls on or applying solder paste to the connection pads 101 and 102 of the semiconductor device 100. Solder bumps need only be formed on at least one of the semiconductor devices 1 and 100.

As illustrated in FIG. 4B, the wiring units 50 and 60 include the lower pads 51 and 61, which are embedded in the encapsulation resin 40, and the upper pads 52 and 62, which are projected from the upper surface 40a of the encapsulation resin 40. The semiconductor device 100 is connected to the upper pads 52 and 62 of the wiring units 50 and 60. Accordingly, upper surfaces of the wiring units 50 and 60, that is, the upper surfaces 52a and 62a of the upper pads 52 and 62 function as external device connection surfaces connected to an external device. In the present example, the surface-processed layers 55 and 65 are formed on the upper surfaces 52a and 62a of the upper pads 52 and 62. Thus, upper surfaces of the surface-processed layers 55 and 65 function as external device connection surfaces. In this manner, the wiring units 50 and 60 are used to connect the semiconductor device 1 and the semiconductor device 100. This reduces the thickness of the semiconductor device 1 compared to a semiconductor device in which multiple wiring boards are stacked. Further, a Package On Package (POP) structure in which the semiconductor devices 1 and 100 are stacked may be reduced in thickness.

As illustrated in FIG. 4B, in the wiring units 50 and 60 of the semiconductor device 1, the upper pads 52 and 62 project upward from the upper surface 40a of the encapsulation resin 40. Further, as described above, the surface-processed layers 55 and 65 are formed on the upper surfaces 52a and 62a of the upper pads 52 and 62.

The solder 111 and the solder 112 cover the upper pads 52 and 62 and surface-processed layers 55 and 65, respectively. Accordingly, the solder 111 and the solder 112 are in contact with the surface-processed layers 55 and 65 and the side surfaces 52b and 62b of the upper pads 52 and 62. In this manner, since the upper pads 52 and 62 project from the upper surface 40a of the encapsulation resin 40, the solder 111 and the solder 112 are applied around the side surfaces 52b and 62b of the upper pads 52 and 62. Thus, each of the solder 111 and the solder 112 has a stable shape in a joined state.

Consequently, the contact area is enlarged and the strength holding the solder 111 and the solder 112 is increased as compared with when the solder 111 and the solder 112 are connected to only the upper surfaces 52a and 62a (surface-processed layers 55 and 65) of the upper pads 52 and 62.

The lower pad 51 of the wiring unit 50 is embedded in the encapsulation resin 40. In the same manner, the lower pad 61 and the connection portion 63 of the wiring unit 60 are embedded in the encapsulation resin 40. Accordingly, delamination of the wiring units 50 and 60 from the encapsulation resin 40 is limited. This obtains the required connection strength between the semiconductor device 1 and the semiconductor device 100.

The side surfaces 51b and 61b of the lower pads 51 and 61 are recessed and curved inwardly into the lower pads 51 and 61 from the lower surfaces 51a and 61a of the lower pads 51 and 61 toward the upper surface 40a of the encapsulation resin 40. Accordingly, the area of the side surfaces 51b and 61b of the lower pads 51 and 61 contacting the encapsulation resin 40 is large compared to when the side surfaces 51b and 61b are linearly formed from the lower surfaces 51a and 61a to the upper surface 40a of the encapsulation resin 40. This limits delamination of the wiring units 50 and 60 from the encapsulation resin 40 and obtains the required connection strength between the semiconductor device 1 and the semiconductor device 100.

Referring to FIG. 4A, the base 71 of the reinforcement plate 70 is embedded in the encapsulation resin 40. The rough-surface plating layer 74 is formed on the lower surface 71a of the base 71. The lower surface 74a of the rough-surface plating layer 74 includes fine irregularities. This increase the area of contact between the rough-surface plating layer 74 and the encapsulation resin 40 as compared with when the base 71 has a smooth lower surface. Since the lower surface 71a of the base 71 (lower surface 74a of rough-surface plating layer 74) is roughened, satisfactory adhesion is obtained between the lower surface 74a and the encapsulation resin 40. This allows the reinforcement plate 70 to be rigidly fixed to the encapsulation resin 40.

Referring to FIG. 4A, the reinforcement plate 70 is arranged on the upper surface 40a of the encapsulation resin 40. The reinforcement plate 70 includes the base 71 of copper or a copper alloy. The base 71 is embedded in the encapsulation resin 40. The rough-surface plating layer 74 rigidly fixes the base 71 to the encapsulation resin 40. The reinforcement plate 70 limits warping of the encapsulation resin 40. Accordingly, the reinforcement plate 70 (base 71) limits warping of the semiconductor device 1 or warping caused by the mounting of the other semiconductor device 100. Further, the base 71 of the reinforcement plate 70 controls warping of the semiconductor device 1 caused by temperature changes.

Figure 3A:
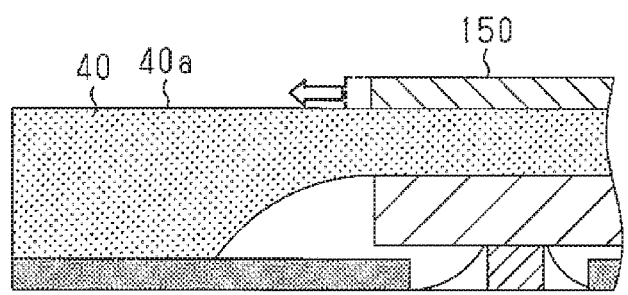
FIG. 3A is a schematic cross-sectional view illustrating the operation of a reinforcement plate in a comparative example.

FIG. 3A illustrates a reinforcement plate 150 in a comparative example. The reinforcement plate 150 is, for example, fixed to the upper surface 40a of the encapsulation resin 40. In the same manner as the reinforcement plate 70 (base 71) of the present embodiment, the reinforcement plate 150 is formed from copper or a copper alloy. Changes in the Temperature contracts or expands the reinforcement plate 150. For example, as illustrated by the broken lines, when the reinforcement plate 150 expands, the expansion force (refer to arrow) produced by the reinforcement plate 150 is applied to the encapsulation resin 40 from the lower surface of the reinforcement plate 150, which is in contact with the encapsulation resin 40. However, the side surfaces of the reinforcement plate 150 do not directly apply the expansion force to the encapsulation resin 40.

Figure 3B:
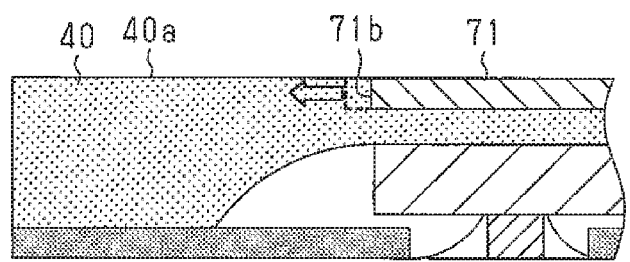
FIG. 3B is a schematic cross-sectional view illustrating the operation of the reinforcement plate in the semiconductor device of FIG. 1A.

In the present embodiment, referring to FIG. 3B, with the base 71 embedded in the encapsulation resin 40, the side surface 71b of the base 71 directly applies the expansion force of the base 71 to the encapsulation resin 40. This allows warping of the semiconductor device 1 to be controlled that would occur when temperature changes contract or expand the reinforcement plate 70 (base 71).

Referring to FIG. 4A, the reinforcement plate 70 includes the heat dissipation portions 72 that are located on the base 71. The heat dissipation portions 72 increase the area of the upper surface of the reinforcement plate 70 that is exposed to the outside from the encapsulation resin 40 as compared with when only one heat dissipation portion 72 is located on the base 71.

The reinforcement plate 70 is located above (upper side as viewed in FIG. 4A) the semiconductor chip 20, which is encapsulated by the encapsulation resin 40. Thus, when the semiconductor chip 20 functions, the heat generated by the semiconductor chip 20 is transmitted through the encapsulation resin 40 to the base 71 of the reinforcement plate 70. The heat is then released into the atmosphere from the upper surface 71c of the base 71 and the upper surfaces (surface-processed layer 75) and the side surfaces 72b of the heat dissipation portions 72. The heat dissipation portions 72 impart a heat dissipation property to the reinforcement plate 70.

The formation of the heat dissipation portions 72 on the upper surface 71c of the base 71 increases the area of the reinforcement plate 70 that is exposed to the outside as compared with when the reinforcement plate 70 is formed by only the base 71. This improves the heat exchanging efficiency, that is, the heat dissipation performance. Further, referring to FIG. 4A, the heat dissipation portions 72 project from the base 71 toward the semiconductor device 100 so that the upper surfaces of the heat dissipation portions 72 are located at positions higher than the upper surface 40a of the encapsulation resin 40. Accordingly, the gas (air) that passes between the encapsulation resin 40 and the semiconductor device 100 comes into contact with the side surfaces 72b of the heat dissipation portions 72. Thus, the heat dissipation portions 72 come into contact with the gas over a larger area than when only the base 71 functions as a heat dissipation portion. This increases the heat exchanging efficiency between the reinforcement plate 70 (heat dissipation portions 72) and the gas and improves the heat dissipation performance.

One example of a method for manufacturing the semiconductor device 1 will now be described with reference to the drawings. The accompanying drawings illustrate a portion of the semiconductor device 1. Portions that ultimately become elements of the semiconductor device 1 are denoted by reference characters that are the same as the ultimate elements. Elements that are described below are denoted with reference characters in the drawings. Otherwise, elements may not be denoted with reference characters.

Figure 5A:
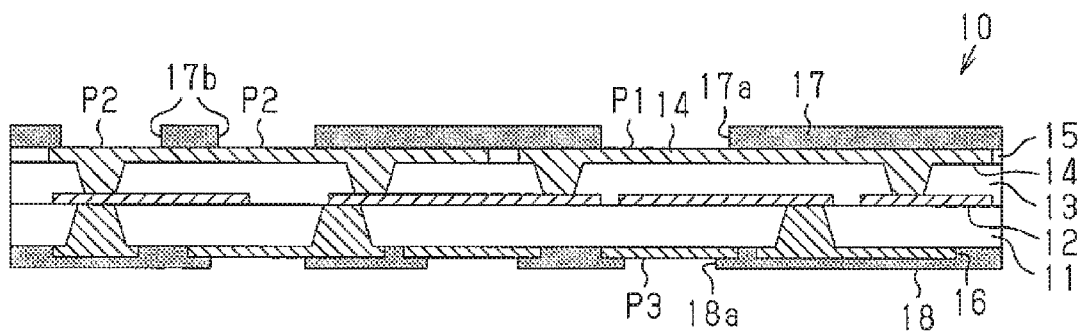
FIGS. 5A to 5C, 6A to 6C, 7A to 7G, 8A to 8C, 9A, and 9B are partial cross-sectional views illustrating a method for manufacturing the semiconductor device of FIG. 1A.

The wiring substrate 10 is prepared as illustrated in FIG. 5A. The wiring substrate 10 is manufactured through a known method. The method will now be briefly described with reference to FIG. 5A.

First, the insulation layer 11 using a glass epoxy substrate or the like described above is prepared. The wiring layer 12 is formed through, for example, a semi-additive process on the upper surface of the insulation layer 11. Then, openings are formed in the insulation layer 11 through, for example, a laser cutting process, and a desmearing process is performed if necessary. The wiring layer 16 is formed through, for example, a semi-additive process on the walls of the openings of the insulation layer 11 and the lower surface of the insulation layer 11. Then, the insulation layer 13 is formed on the upper surface of the insulation layer 11 by laminating an insulative resin film of a thermosetting epoxy resin to cover the wiring layer 12. A liquid or paste of an insulative resin of a thermosetting epoxy resin or the like may be applied to the upper surface of the insulation layer 11 and hardened to form the insulation layer 13.

Then, openings are formed in the insulation layer 13 through, for example, a laser cutting process, and a desmearing process is performed if necessary. The wiring layer 14 is formed through, for example, a semi-additive process on the walls of the openings of the insulation layer 13 and the upper surface of the insulation layer 13. Then, an insulative resin film of a thermosetting epoxy resin is laminated and hardened on the upper surface of the insulation layer 13 to cover the wiring layer 14. Subsequently, for example, Chemical Mechanical Polishing (CMP) is performed until the insulative resin film is exposed from the upper surface of the wiring layer 14 to form the insulation layer 15.

Then, the protective insulation layer 17 including the openings 17a and 17b is formed on the upper surface of the wiring layer 14 and the upper surface of the insulation layer 15. Further, the solder resist layer 18 including the openings 18a is formed on the lower surface of the insulation layer 11. For example, a photosensitive resin film may be laminated onto the upper surface of the wiring layer 14 and the upper surface of the insulation layer 15. Otherwise, a liquid or paste of resin may be applied to the upper surface of the wiring layer 14 and the upper surface of the insulation layer 15. In such cases, the resin undergoes exposure and development when photolithography is performed. This patterns the resin into a given shape and obtains the protective insulation layer 17. In the same manner, for example, a photosensitive resin film may be laminated onto the lower surface of the insulation layer 11. Otherwise, a liquid or paste of resin may be applied to the lower surface of the insulation layer 11. In such cases, the resin undergoes exposure and development when photolithography is performed. This patterns the resin into a given shape and obtains the solder resist layer 18. The openings 17a and 17b in the protective insulation layer 17 expose portions of the wiring layer 14 as the component pads P1 and the connection pads P2.

Figure 5B:
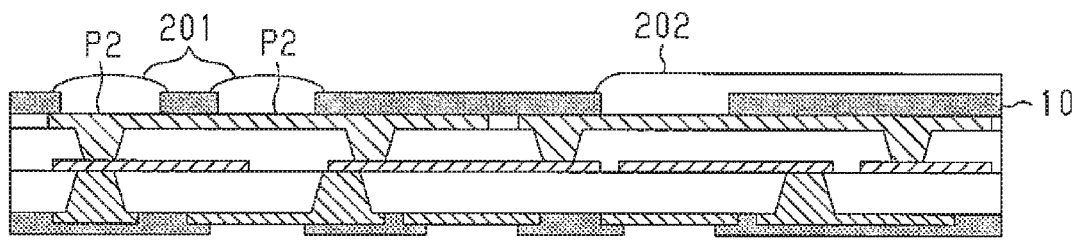

As illustrated in FIG. 5B, flux 201 is applied to the connection pads P2 of the wiring substrate 10. Further, flux 202 is applied to the region where the semiconductor chip 20 illustrated in FIG. 1A is applied. Then, referring to FIG. 5C, the connection members 30 (solder balls) are mounted on the connection pads P2. The connection members 30 undergo a reflow process at a given temperature (e.g., 240° C. to 260° C.) to fix the connection members 30 to the connection pads P2.

Figure 5C:
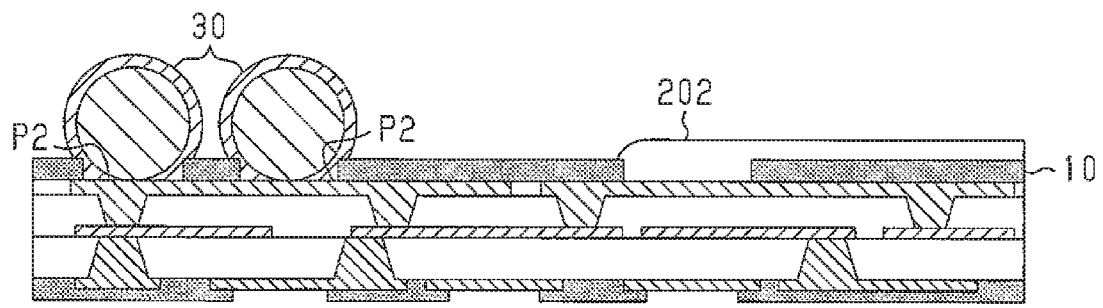
Figure 6A:
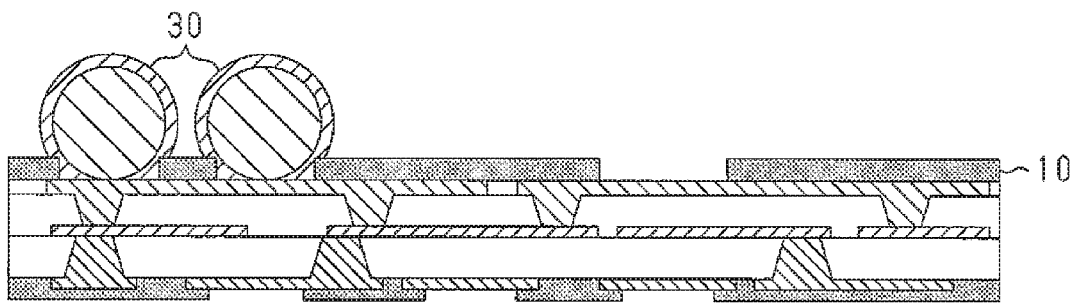

Referring to FIG. 6A, the surface of the structure illustrated in FIG. 5C is cleaned to remove the flux 202.

Figure 6B:
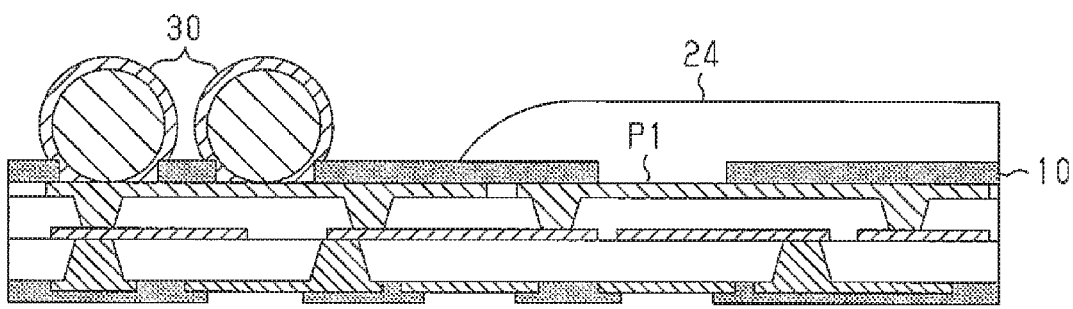

Referring to FIG. 6B, the underfill resin 24, which is in a semi-cured state (B-stage state), is arranged in the region corresponding to the semiconductor chip 20 (refer to FIG. 1A). The underfill resin 24 covers the component pads P1.

Figure 6C:
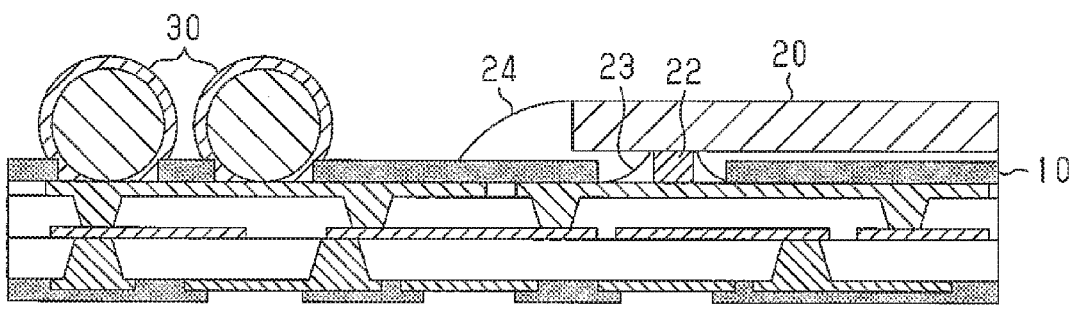

Referring to FIG. 6C, the semiconductor chip 20 is flip-chip-mounted on the wiring substrate 10. When flip-chip-mounting the semiconductor chip 20, the joining members 23 (solder) are adhered to the projected electrodes 22 of the semiconductor chip 20. Further, the semiconductor chip 20 is pressed into the underfill resin 24 so that the projected electrodes 22 contact the component pads P1. After the joining members 23 joins the projected electrodes 22 of the semiconductor chip 20 with the component pads P1, the underfill resin 24 is hardened. The joining members 23 may be solder paste that is applied to the component pads P1, and the solder paste may join the projected electrodes 22 of the semiconductor chip 20 with the component pads P1.

Figure 7A:
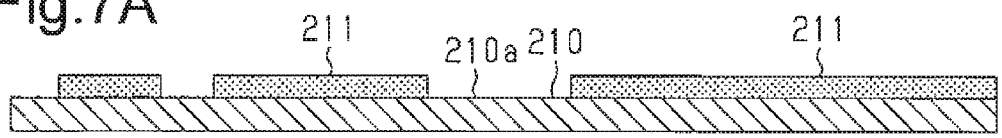

Referring to FIG. 7A, a metal plate 210 is prepared. The material of the metal plate 210 may be, for example, copper or a copper alloy. The metal plate 210 has a thickness of, for example, 50 to 150 µm, preferably 100 µm. For example, a plate used to form a lead frame of a semiconductor package may be used as the metal plate 210.

An etching mask 211 is formed on one surface (upper surface 210a in FIG. 7A) of the metal plate 210. The etching mask 211 is formed at a position corresponding to the portions of the wiring units 50 and 60 and the reinforcement plate 70 that are embedded in the encapsulation resin 40 of the semiconductor device 1 illustrated in FIG. 1A. The wiring unit 50 includes the lower pad 51 that is embedded in the encapsulation resin 40, and the wiring unit 60 includes the lower pad 61 and the connection portion 63 that are embedded in the encapsulation resin 40. The reinforcement plate 70 includes the base 71 that is embedded in the encapsulation resin 40. In FIG. 7A, the etching mask 211 covers the upper surface 210a of the metal plate 210 at a position corresponding to the lower pads 51 and 61, the connection portion 63 and the base 71.

The etching mask 211 is, for example, a resist layer. The material of the resist layer may be resistant to etching that is performed in the following step. For example, the resist layer may be formed by a photosensitive dry film resist or a liquid photoresist. Such a resist layer may be formed from, for example, a novolac resin or an acrylic resin. When using a photosensitive dry film resist, for example, a dry film is laminated to the upper surface 210a of the metal plate 210 through thermal compression bonding. Then, the dry film is patterned by undergoing exposure and development to form the resist layer. When using a liquid photoresist, similar steps are performed to form the resist layer. The etching mask 211 may be, for example, a plating layer formed from a single metal such as gold (Au) or a surface-processed layer formed from at least one of Au, palladium (Pd), and nickel (Ni).

Figure 7B:
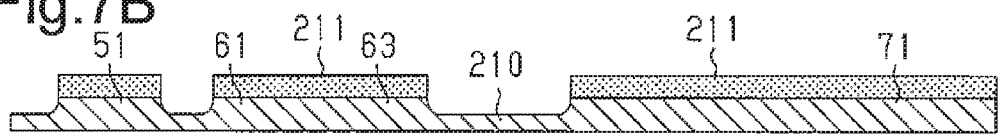

Referring to FIG. 7B, the metal plate 210 is half-etched to a given depth using the etching mask 211 to reduce the thickness of the metal plate 210. This forms the lower pads 51 and 61, the connection portion 63, and the base 71 that project from the metal plate 210 that has been reduced in thickness. Preferably, the depth of the half-etching is approximately one half of the thickness of the metal plate 210, that is, 25 to 75 µm. After the half-etching process, the etching mask 211 is removed. When using the etching mask 211 as a resist layer, the etching mask 211 is removed by performing an asking process or using an alkali delamination liquid.

Figure 7C:
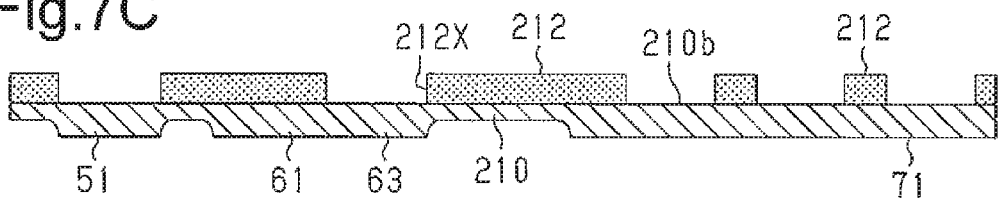

Referring to FIG. 7C, the metal plate 210, which has been thinned, includes another surface 210b. A resist layer 212 that includes openings 212X is formed at given locations on the surface 210b. In FIG. 7C, the metal plate 210, which was thinned in the step of FIG. 7B, is reversed upside down. The openings 212X expose regions corresponding to the upper pads 52 and 62 and the heat dissipation portions 72 illustrated in FIG. 1A.

The material of the resist layer 212 may be resistant to etching that is performed in the following step. For example, the resist layer 212 may be formed by a photosensitive dry film resist. Such a resist material may be, for example, a novolac resin or an acrylic resin. For example, a dry film is laminated to the upper surface of the metal plate 210, which has been thinned, through thermal compression bonding. Then, photolithography is performed to pattern the dry film and form the resist layer 212 that includes the openings 212X. A liquid photoresist (e.g., liquid resist such as a novolac resin or an acrylic resin) may be used to form the resist layer 212.

Figure 7D:
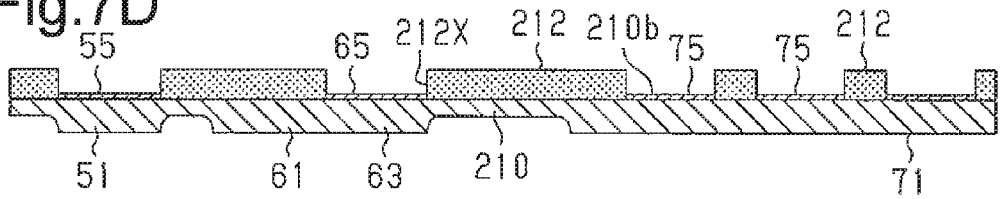

Referring to FIG. 7D, electrolytic plating is performed using the resist layer 212 as a plating mask and the metal plate 210 as a plating power supplying layer to form the surface-processed layers 55, 65, and 75 on the upper surface 210b of the metal plate 210 that is exposed through the openings 212X. For example, when each of the surface-processed layers 55, 65, and 75 is a Ni layer/Pd layer/Au layer, a Ni layer, a Pd layer, and an Au layer are laminated in this order on the upper surface 210b of the metal plate 210 to form the surface-processed layers 55, 65, and 75. Then, for example, an alkali delamination liquid is used to remove the resist layer 212. In FIGS. 7C and 7D, the upper surface 210b of the metal plate 210 is covered by the resist layer 212. However, the lower surface of the metal plate 210, on which the lower pads 51 and 61, the connection portion 63, and the base 71 are formed, may also be covered by a resist layer for protection from plating liquid.

Figure 7E:
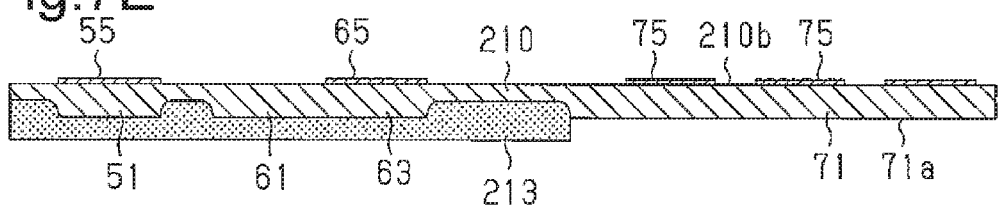

Referring to FIG. 7E, a resist layer 213 is formed so as to expose the lower surface 71a of the base 71 to the outside. The material of the resist layer 213 may be, for example, resistant to etching that is performed in the following step like the resist layer 212.

Figure 7F:
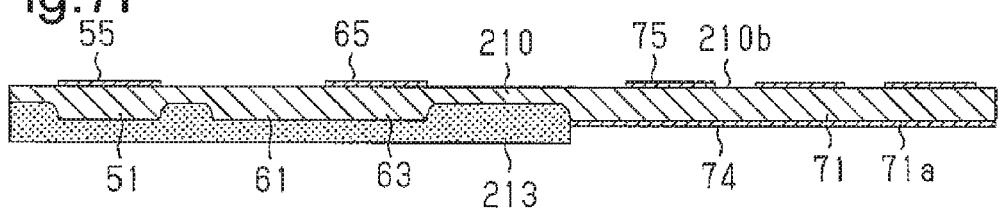

Referring to FIG. 7F, electrolytic plating may be performed using the metal plate 210 as a power supplying layer to form the rough-surface plating layer 74 on the lower surface 71a of the base 71. Then, the resist layer 213 is removed with, for example, an alkali delamination liquid. In FIGS. 7E and 7F, the resist layer 213, from which the lower surface 71a of the base 71 is exposed to the outside, is formed on the lower surface of the metal plate 210. However, the upper surface of the metal plate 210, on which the surface-processed layers 55, 65, and 75 are formed, may also be covered by a resist layer for protection from plating liquid.

Figure 7G:
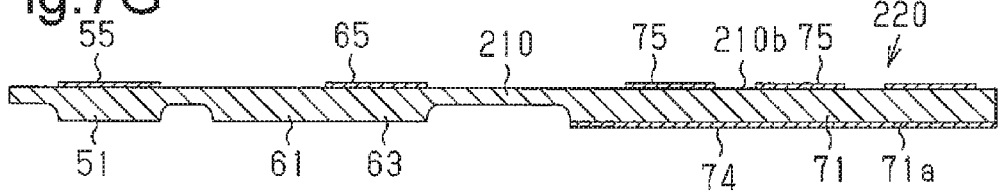

The steps described above are performed to obtain a structure 220 that is illustrated in FIG. 7G. The structure 220 includes the lower pads 51 and 61, the connection portion 63, and the base 71 that project from the lower surface of the thinned metal plate 210 and the surface-processed layers 55, 65, and 75 that project from the upper surface 210b. Further, the structure 220 includes the rough-surface plating layer 74 formed on the lower surface 71a of the base 71.

Figure 8A:
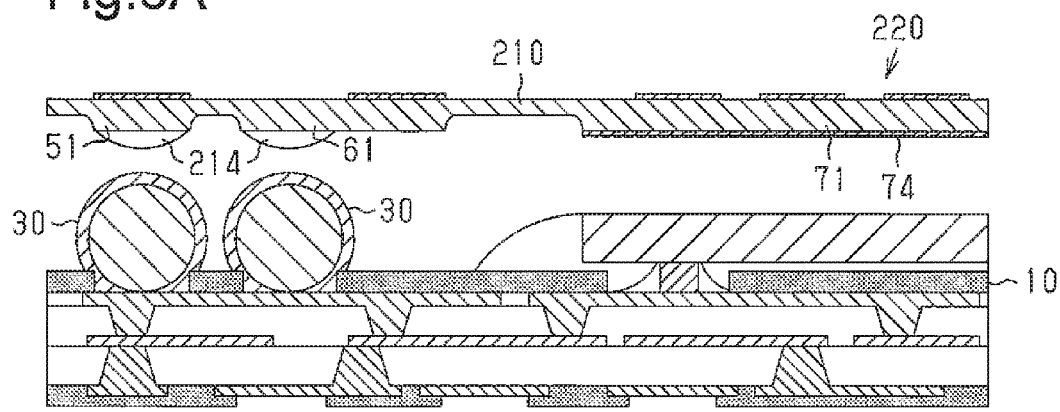

Referring to FIG. 8A, flux 214 is applied to the lower surfaces of the lower pads 51 and 61 of the structure 220. A film of copper oxide is formed on the lower surface of the structure 220 excluding the portion where the rough-surface plating layer 74 is formed. Such an oxide film is formed in, for example, the step in which the structure 220 is formed through a heat process or a heat history in various types of processes. The oxide film lowers the solder wettability. The flux 214 improves the solder wettability at the lower surfaces of the lower pads 51 and 61. The structure 220 is arranged on the wiring substrate 10. The lower pads 51 and 61 of the structure 220 are positioned relative to the connection members 30 of the wiring substrate 10.

Figure 8B:
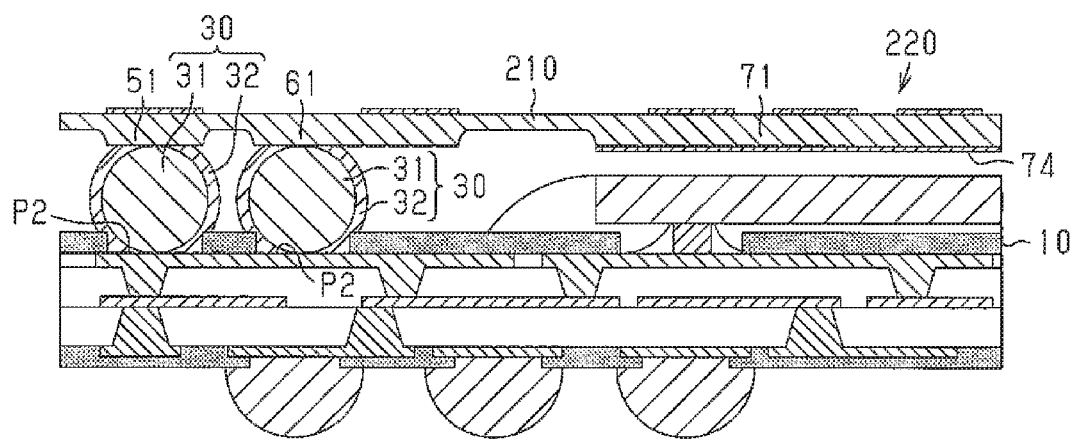

Referring to FIG. 8B, the lower pads 51 and 61 are connected to the connection members 30. For example, the structure 220 is arranged on the wiring substrate 10 and then heated in a reflow furnace to a temperature of 230° C. to 250° C. This melts the conductive material 32 on the connection members 30 and connects the connection members 30 to the lower pads 51 and 61. The core 31 of each connection member 30 functions as a spacer that keeps the structure 220 separated from the wiring substrate 10 by a given distance. In this manner, the connection members 30 electrically connect the connection pads P2 of the wiring substrate 10 to the lower pads 51 and 61 of the structure 220 in addition to fixing the structure 220 above the wiring substrate 10.

Figure 8C:
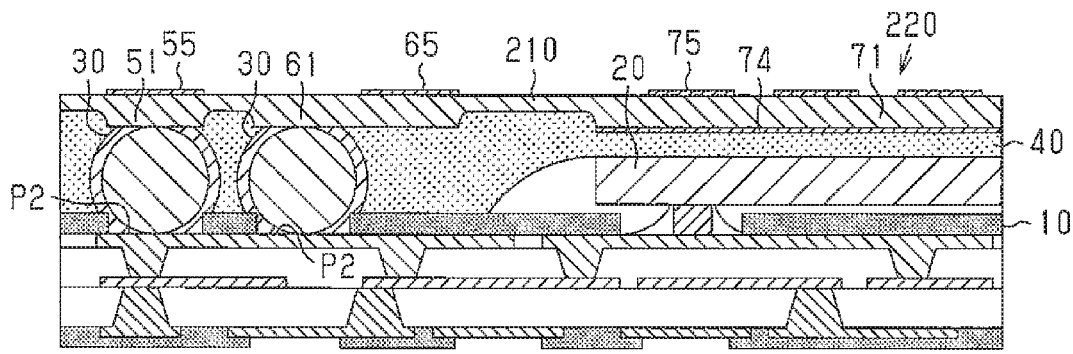

Referring to FIG. 8C, the space between the wiring substrate 10 and the structure 220 is filled with the encapsulation resin 40. The encapsulation resin 40 encapsulates the semiconductor chip 20, which is mounted on the wiring substrate 10, and the connection members 30. The encapsulation resin 40 rigidly fixes the structure 220 above the wiring substrate 10.

For example, when using a thermosetting molding resin as the material of the encapsulation resin 40, the structure of FIG. 8B is arranged in a mold, and the mold is charged with fluidized mold resin. The mold resin is heated to a given temperature (e.g., 180° C.) and hardened to form the encapsulation resin 40.

Figure 9A:
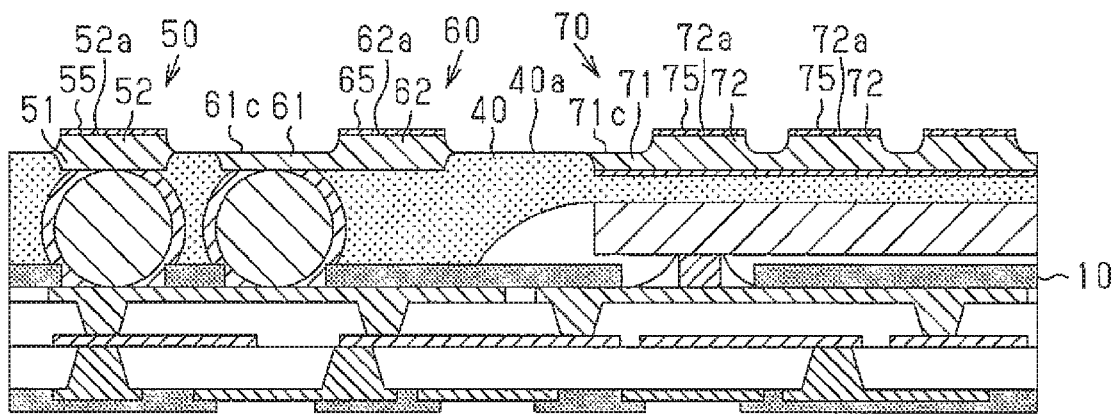

Then, the metal plate 210 of the structure 220 is etched to form the wiring units 50 and 60 and the reinforcement plate 70 illustrated in FIG. 9A. The surface-processed layers 55, 65, and 75 are formed on the upper surface 210b of the metal plate 210. The metal plate 210 of the structure 220 is half-etched using the surface-processed layers 55, 65, and 75 as etching masks. The half-etching forms the upper pads 52 and 62 and the heat dissipation portions 72, as illustrated in FIG. 9A, and separates the wiring units 50 and 60 and the reinforcement plate 70, which includes the heat dissipation portions 72, from one another.

In the wiring unit 60, portions of the upper pad 62 other than that covered by the surface-processed layer 65 are half-etched to form the lower pad 61 that is embedded in the encapsulation resin 40. The upper surface 61c of the lower pad 61 is substantially flush with the upper surface 40a of the encapsulation resin 40. In the reinforcement plate 70, parts of the heat dissipation portions 72 other than that covered by the surface-processed layer 75 are half-etched to form the base 71 that is embedded in the encapsulation resin 40. The upper surface 71c of the base 71 is generally flush with the upper surface 40a of the encapsulation resin 40. In this manner, etching is performed to expose the upper surface 40a of the encapsulation resin 40 and separate the wiring units 50 and 60 and the reinforcement plate 70 from one another.

Figure 9B:
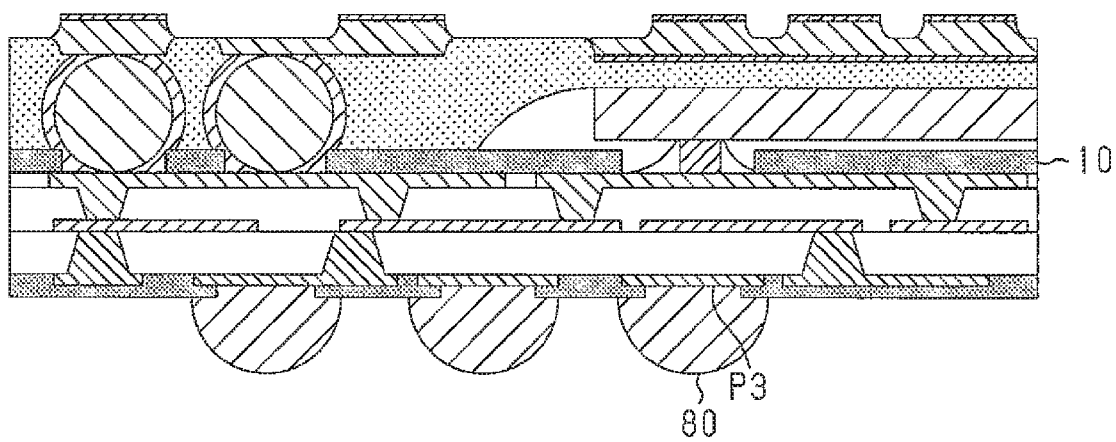

Referring to FIG. 9B, the bumps 80 are formed on the external connection pads P3 at the lower surface of the wiring substrate 10. The bumps 80 are formed by, for example, performing a reflow process on solder balls or solder paste arranged on the external connection pads P3.

The first embodiment has the advantages described below.

(1) The semiconductor device 1 includes the wiring substrate 10, the semiconductor chip 20, the connection members 30, the encapsulation resin 40, the wiring units 50 and 60, and the reinforcement plate 70. The component pads P1 and the connection pads P2 are formed on the upper surface of the wiring substrate 10. The semiconductor chip 20 is connected to the component pads P1. The connection members 30 are connected to the connection pads P2. The encapsulation resin 40 covers the upper surface of the wiring substrate 10 and encapsulates the semiconductor chip 20 and the connection members 30. The wiring units 50 and 60 are arranged in the upper surface 40a of the encapsulation resin 40. The wiring units 50 and 60 include the lower pads 51 and 61, which are embedded in the encapsulation resin 40, and the upper pads 52 and 62, which project from the upper surface 40a of the encapsulation resin 40. The upper pads 52 and 62 are connected to the other semiconductor device 100, which is arranged on the semiconductor device 1.

In this manner, the upper pads 52 and 62, which are connected to the semiconductor device 100, project from the upper surface 40a of the encapsulation resin 40. This reduces the thickness of the semiconductor device 1 as compared with when stacking wiring substrates and encapsulating the semiconductor chips between the wiring substrates.

(2) In the wiring units 50 and 60, the upper pads 52 and 62 project from the upper surface 40a of the encapsulation resin 40. In the wiring units 50 and 60 that are shaped in this manner, the solder 111 and the solder 112 that connect the semiconductor device 100 extend around the side surfaces 52b and 62b of the upper pads 52 and 62, respectively. This stabilizes the shape of the solder 111 and the shape of the solder 112 in each joined state. Thus, even when the distance is small between the wiring units 50 and 60, short-circuiting is prevented between the wiring units 50 and 60.

(3) The side surfaces 52b and 62b of the upper pads 52 and 62 are recessed and curved inwardly into the upper pads 52 and 62. Accordingly, when the semiconductor device 100 is connected to the upper pads 52 and 62, the area of the solder 111 that is in contact with the upper pad 52 and the area of the solder 112 that is in contact with the upper pad 62 are increased. This increases the strength holding the solder 111 and the solder 112.

(4) The side surfaces 51b and 61b of the lower pads 51 and 61 are recessed and curved inwardly into the lower pads 51 and 61. Accordingly, the lower pads 51 and 61 are in contact with the encapsulation resin 40 over a large area. Thus, the strength connecting the lower pads 51 and 61 with the encapsulation resin 40 is high.

(5) The reinforcement plate 70 is arranged on the upper surface 40a of the encapsulation resin 40. The reinforcement plate 70 includes the base 71 formed of copper or a copper alloy. The base 71 is embedded in the encapsulation resin 40. The reinforcement plate 70 limits warping of the encapsulation resin 40. Accordingly, the reinforcement plate 70 limits warping of the semiconductor device 1 or warping caused by the mounting of the other semiconductor device 100.

(6) The rough-surface plating layer 74 is formed on the lower surface 71a of the base 71. The lower surface 74a of the rough-surface plating layer 74 includes fine irregularities. This increases the area of contact between the rough-surface plating layer 74 and the encapsulation resin 40 as compared with when the base 71 has a smooth lower surface. Since the lower surface 71a of the base 71 (lower surface 74a of rough-surface plating layer 74) is roughened, satisfactory adhesion is obtained between the lower surface 74a and the encapsulation resin 40. This allows the reinforcement plate 70 to be rigidly fixed to the encapsulation resin 40.

(7) The reinforcement plate 70 includes the heat dissipation portions 72 that are located on the upper surface of the base 71. Each heat dissipation portion 72 extends upwardly from the upper surface of the base 71. The heat dissipation portions 72 are exposed to the outside from the encapsulation resin 40. This increases the area of the upper surface of the reinforcement plate 70 that is exposed to the outside as compared with when only one heat dissipation portion 72 is located on the base 71. Further, the reinforcement plate 70 releases the heat generated by the semiconductor chip 20, which is embedded in the encapsulation resin 40, into the atmosphere. In this manner, the heat dissipation portions 72 impart a heat dissipation property to the reinforcement plate 70 and efficiently release heat from the semiconductor chip 20.

(8) The heat dissipation portions 72 project upwardly from the upper surface 71c of the base 71 toward the semiconductor device 100 so that the upper surfaces 72a of the heat dissipation portions 72 (surface-processed layer 75) are located at a higher position that the upper surface 40a of the encapsulation resin 40. Accordingly, the gas (air) that passes between the encapsulation resin 40 and the semiconductor device 100 comes into contact with the side surfaces 72b of the heat dissipation portions 72. Thus, the heat dissipation portions 72 come into contact with the gas over a larger area than when the exposed portion of the reinforcement plate 70 is only the base 71. This obtains a high heat dissipation effect.

It should be apparent to those skilled in the art that the foregoing embodiments may be employed in many other specific forms without departing from the scope of the disclosure. Particularly, it should be understood that the foregoing embodiments may be employed in the following forms.

In the above embodiment, the shapes of the wiring units 50 and 60 and the etched regions of the wiring units 50 and 60 may be changed. For example, as described below, elements other than wiring units may be embedded in the encapsulation resin 40.

FIGS. 10A to 10E are partial perspective views illustrating manufacturing steps of a semiconductor device. FIGS. 10A to 10E are schematic views illustrating how each step is processed in a simplified manner to aid understanding and may differ from actual scale and shape.

Figure 10A:
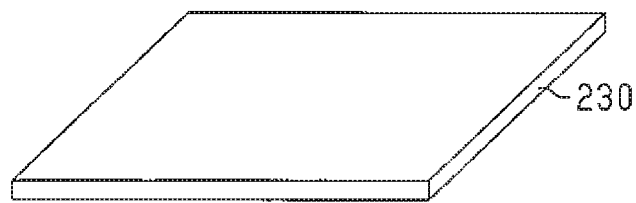
FIGS. 10A to 10E are perspective views illustrating a method for manufacturing a wiring unit.
Figure 10B:
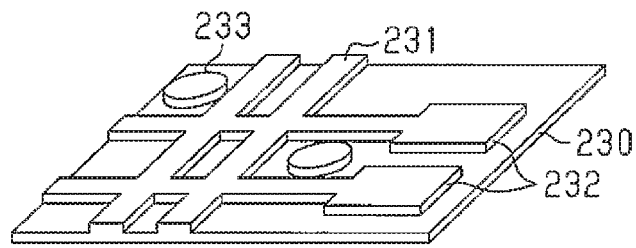

A metal plate 230 is prepared as illustrated in FIG. 10A. As illustrated in FIG. 10B, the metal plate 230 is half-etched to form wirings 231, lower pads 232, and the dummy patterns 233. In this example, the lower pads 232 each have a square shape in a plan view, and the dummy patterns 233 each have a circular shape in a plan view. The line-and-space (L/S) of the wirings 231 defined by wiring width (L)/wiring interval (S) is, for example, 50 μm/50 μm. The wiring interval is the distance between two adjacent wirings 231.

Figure 10C:
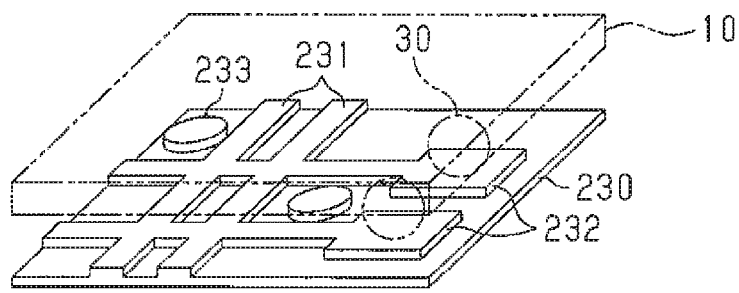
Figure 10D:
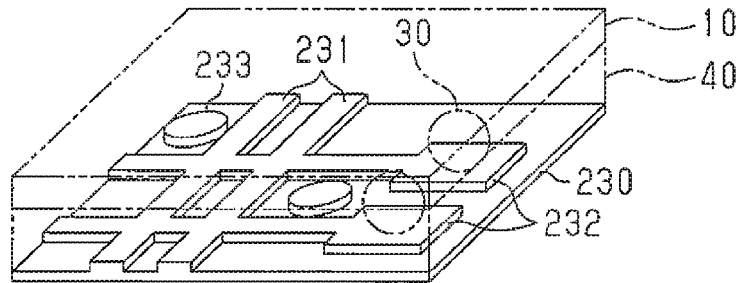

Referring to FIG. 10C, the wiring substrate 10 is positioned. The connection members 30 are connected to the wiring substrate 10. The connection members 30 are connected to the lower pads 232. In FIGS. 10C and 10D, the wiring substrate 10 and the connection members 30 are illustrated in double-dashed lines to aid understanding of the shape of the metal plate 230.

Referring to FIG. 10D, the encapsulation resin 40 is formed between the metal plate 230 and the wiring substrate 10.

Figure 10E:
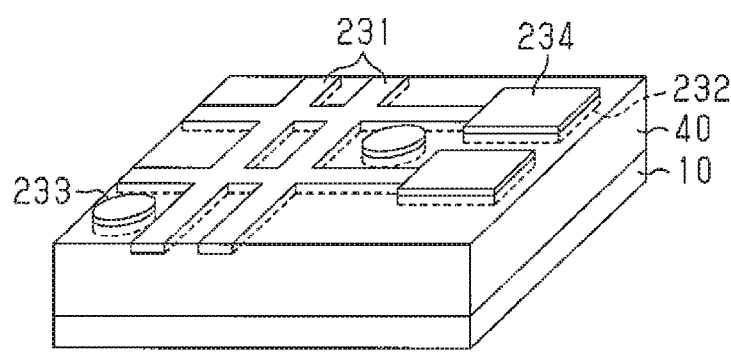

Referring to FIG. 10E, the metal plate 230 is etched so that upper pads 234 and the dummy patterns 233 project from the upper surface 40a of the encapsulation resin 40. FIG. 10E illustrates the structure of FIG. 10D reversed upside down. In this step, the portions of the metal plate 230 projecting from the upper surface 40a of the encapsulation resin 40 are etched and removed in the same manner as the step of FIG. 9A. This embeds the wirings 231 in the encapsulation resin 40 and allows the wirings 231 embedded in the encapsulation resin 40 to be fine.

In the above embodiment, the upper and lower pads may be shaped differently.

Figure 11A:
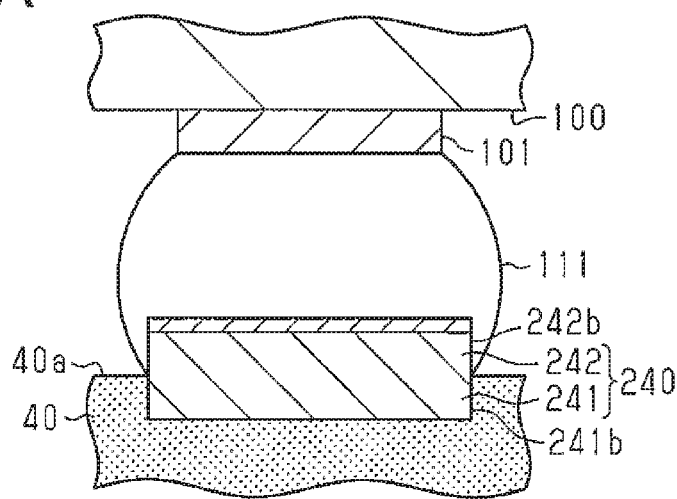
FIGS. 11A to 11C are cross-sectional views illustrating wiring units in various modified examples.

For example, referring to FIG. 11A, a side surface 241b of a lower pad 241 and a side surface 242b of an upper pad 242 may be orthogonal to the upper surface 40a of the encapsulation resin 40. Even in a wiring unit 240 having such a shape, in the same manner as the above embodiment, solder 111, which connects the semiconductor device 100, extends around the side surface 242b of the upper pad 242.

This stabilizes the shape of the solder 111 in a joined state. Thus, short-circuiting is prevented between the wiring units 240 even when the distance is short between adjacent wiring units 240.

Figure 11B:
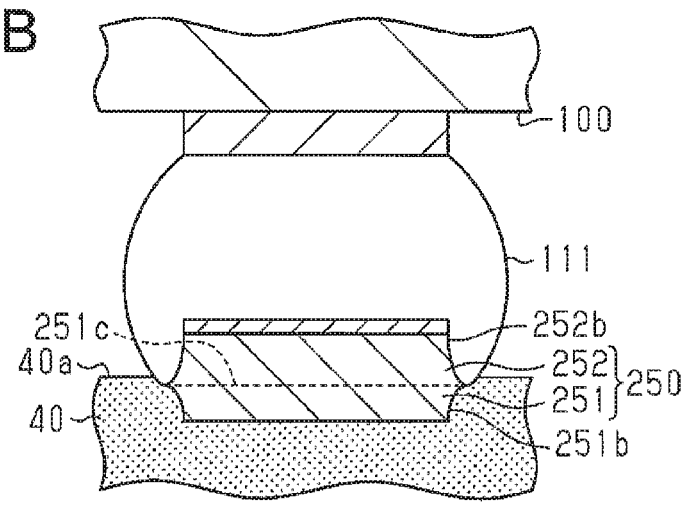

Alternatively, as illustrated in FIG. 11B, an upper surface 251c of a lower pad 251 (indicated by broken line in FIG. 11B), which is embedded in the encapsulation resin 40, may be located at a lower position than the upper surface 40a of the encapsulation resin 40. FIG. 11B illustrates a modified example of the wiring unit 50 of FIG. 1A as a wiring unit 250. The modified example may also be applied to the wiring unit 60 of FIG. 1A. In this case, the upper surface 251c of the lower pad 251 embedded in the encapsulation resin 40 is located at a lower position than the upper surface 40a of the encapsulation resin 40 and exposed from the encapsulation resin 40. In the wiring unit 250 of FIG. 11B, a side surface 251b of the lower pad 251 is curved so that the curved side surface 251b widens outwardly toward the upper surface 40a of the encapsulation resin 40. In the wiring unit 250, the etching time of the metal plate 210 (refer to FIG. 9C) in a step for forming an upper pad 252 is longer than the time taken to expose the upper surface 40a from the encapsulation resin 40. In the structure of FIG. 11B, a side surface 252b of the upper pad 252 exposed from the encapsulation resin 40 has a larger area than that exposed in the above embodiment. This increases the holding strength of the solder 111 that is connected to the wiring unit 250.

Figure 11C:
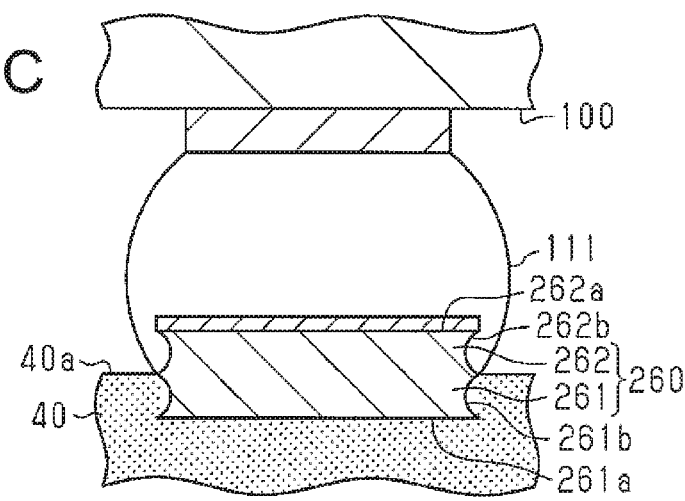

Alternatively, as illustrated in FIG. 11C, a side surface 261b of a lower pad 261 may be constricted in a recessed manner so that a middle portion in the thickness-wise direction of the lower pad 261 is located most inward. Further, a side surface 262b of an upper pad 262 may be constricted in a recessed manner so that a middle portion in the thickness-wise direction of the upper pad 262 is located most inward. In this manner, the side surface 261b of the lower pad 261 is curved further inward from an outer end (lateral end in FIG. 11C) of a lower surface 261a of the lower pad 261 to form a recess. In this structure, the encapsulation resin 40 extends into the recess defined in the side surface 261b. This increases the strength connecting the encapsulation resin 40 and a wiring unit 260. In the same manner, the side surface 262b of the upper pad 262 is curved further inward from an outer end (lateral end in FIG. 11C) of an upper surface 262a of the upper pad 262 to form a recess. Thus, the solder 111 extends into the recess defined in the side surface 262b of the upper pad 262 and increases the strength holding the solder 111.

In the above embodiment, the reinforcement plate 70 may be changed in shaped, for example, as described below.

Figure 12A:
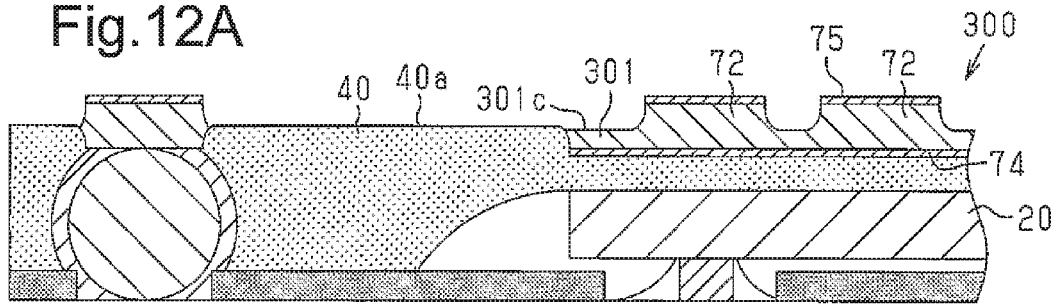
FIGS. 12A to 12D are partial cross-sectional views illustrating semiconductor devices in various modified examples.

Referring to FIG. 12A, a reinforcement plate 300 includes a base 301 that is embedded in the encapsulation resin 40 and the heat dissipation portions 72 that are formed on an upper surface 301c of the base 301. The upper surface 301c of the base 301 is located at a lower position than the upper surface 40a of the encapsulation resin 40. In other words, the base 301 is thinner than the base 71 of the above embodiment. The location of the upper surface 301c of the base 301, that is, the thickness of the base 301, allows for control of the half-etching time or the like. The thickness of the base 301 affects the warping of a semiconductor device. Accordingly, warping of a semiconductor device may be controlled with the thickness of the base 301.

Figure 12B:
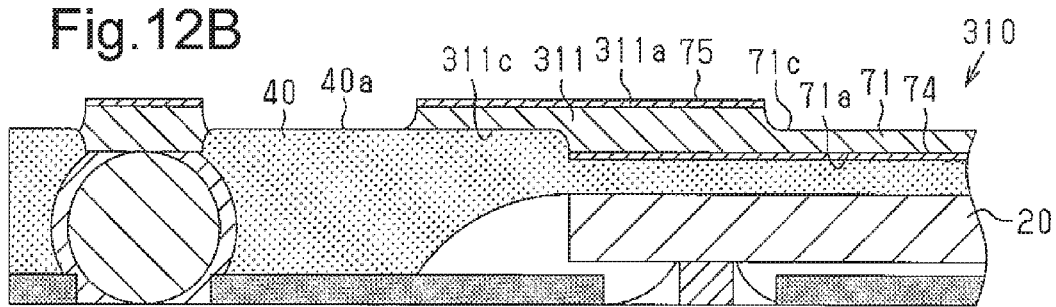

Referring to FIG. 12B, a reinforcement plate 310 includes the base 71 that is embedded in the encapsulation resin 40 and a heat dissipation portion 311 that is formed on the upper surface 71c of the base 71. The surface-processed layer 75 is formed on an upper surface 311a of the heat dissipation portion 311. The heat dissipation portion 311 extends in the horizontal direction from an end (left end as viewed in FIG. 12B) of the base 71 on the upper surface 40a of the encapsulation resin 40. In this manner, the heat dissipation portion 311 may be formed over a larger area that the region where the base 71 is formed in a plan view. This structure increases the area of the upper surface of the reinforcement plate 310 that is exposed from the encapsulation resin 40. That is, the area in contact with the atmosphere is increased. This improves the heat dissipation effect. FIG. 12B illustrates only the heat dissipation portion 311 that is located on the upper surface 40a of the encapsulation resin 40. However, the heat dissipation portions 72 of the above embodiment may be formed on the base 71 at locations separated from the heat dissipation portion 311.

In FIG. 12B, a rough-surface plating layer may be formed on a lower surface 311c of the heat dissipation portion 311 located on the upper surface 40a of the encapsulation resin 40 in the same manner as the rough-surface plating layer 74 on the lower surface 71a of the base 71. The rough-surface plating layer rigidly fixes the heat dissipation portion 311 to the upper surface 40a of the encapsulation resin 40. This restricts delamination of the end of the heat dissipation portion 311 from the encapsulation resin 40.

Figure 12C:
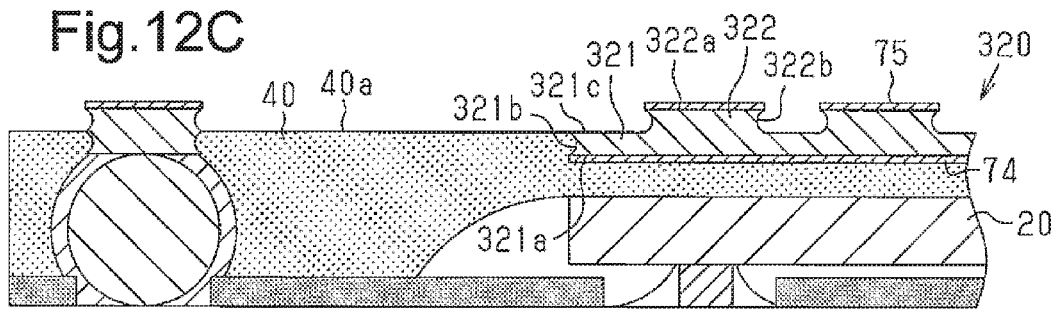

Referring to FIG. 12C, a reinforcement plate 320 includes a base 321 embedded in the encapsulation resin 40 and heat dissipation portions 322 formed on an upper surface 321c of the base 321. The base 321 includes a side surface 321b that is constricted in a concave manner so that the middle of the side surface 321b in the thickness-wise direction of the base 321 is located at an innermost position. In this manner, the side surface 321b of the base 321 is recessed and curved inward from the outer end (left end as viewed in FIG. 12C) of a lower surface 321a of the base 321. With this structure, the encapsulation resin 40 enters a recess defined in the side surface 321b. This restricts delamination of the end of the base 321 from the encapsulation resin 40.

In FIG. 12C, each heat dissipation portion 322 includes a side surface 322b that is constricted in a concave manner so that the middle of the side surface 322b in the thickness-wise direction of the heat dissipation portion 322 is located at an innermost position. In this manner, the side surface 322b of the heat dissipation portion 322 is recessed and curved inward from the end of an upper surface 322a of the heat dissipation portion 322. With this structure, the area of the side surface 322b of the heat dissipation portion 322 (i.e., exposed area of reinforcement plate 320) is increased as compared with the above embodiment. This improves the heat dissipation performance.

Figure 12D:
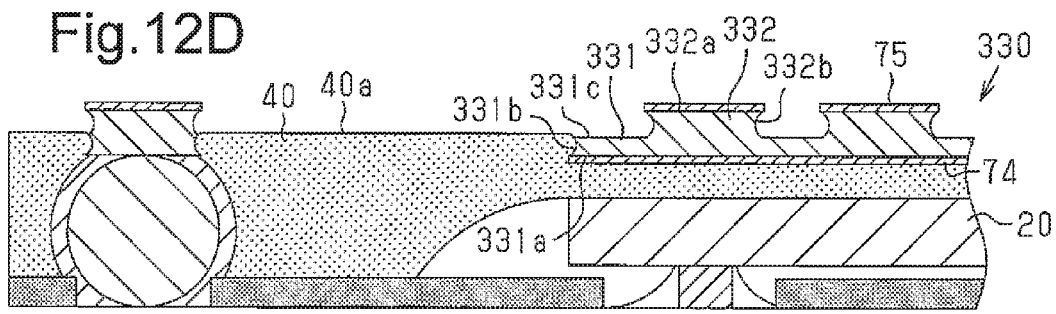

Referring to FIG. 12D, a reinforcement plate 330 includes a base 331 that is embedded in the encapsulation resin 40 and heat dissipation portions 332 formed on an upper surface 331c of the base 331. The base 331 includes a side surface 331b that is constricted in a concave manner so that the middle of the side surface 331b in the thickness-wise direction of the base 331 is located at an innermost position. In this manner, the side surface 331b of the base 331 is recessed and curved inward from the end (left end as viewed in FIG. 12D) of a lower surface 331a of the base 331. Further, the upper surface 331c of the base 331 is located at a lower position than the upper surface 40a of the encapsulation resin 40. With this structure, warping of a semiconductor device may be controlled with the thickness of the base 331. This restricts delamination of the end of the base 331 from the encapsulation resin 40.

In FIG. 12D, each heat dissipation portion 332 includes a side surface 332b that is constricted in a concave manner so that the middle of the side surface 332b in the thickness-wise direction of the heat dissipation portion 332 is located at an innermost position. In this manner, the side surface 332b of the heat dissipation portion 332 is recessed and curved inward from the end of an upper surface 332a of the heat dissipation portion 332. With this structure, the area of the side surface 332b of the heat dissipation portion 332 (i.e., exposed area of reinforcement plate 330) is increased as compared with the above embodiment. This improves the heat dissipation performance.

Figure 13:
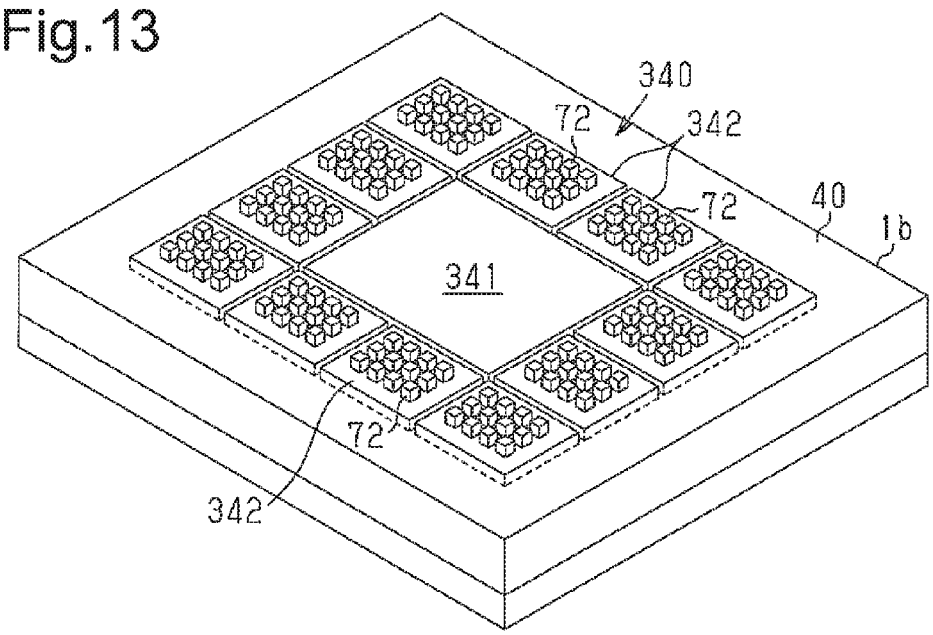
FIG. 13 is a perspective view illustrating a semiconductor device of a modified example.

FIG. 13 illustrates a semiconductor device 1b of a modified example. The encapsulation resin 40 of the semiconductor device 1b includes a first base 341 and second bases 342 that are embedded in the encapsulation resin 40. In FIG. 13, the first base 341 is located at the center of the semiconductor device 1b. The second bases 342, which are smaller than the first base 341, surround the first base 341. The heat dissipation portions 72 are formed integrally with the upper surface of each second base 342. However, the upper surface of the first base 341 is free from heat dissipation portions. For example, a separate heat dissipation member (e.g., heat sink) may be secured to the upper surface of the first base 341.

The arrangement of the first base 341 and the second bases 342 that have different sizes allows warping of the semiconductor device 1b to be controlled. Further, the existence of a heat dissipation member (e.g., heat sink) on the first base 341 allows for control of the heat dissipation amount.

In FIG. 13, the semiconductor device 1b may include only the second bases 342. Alternatively, the semiconductor device 1b may include multiple first bases 341. In this case, another heat dissipation member (e.g., heat sink) may be selectively secured to at least one of the first bases 341 to control the heat dissipation amount.

Figure 14A:
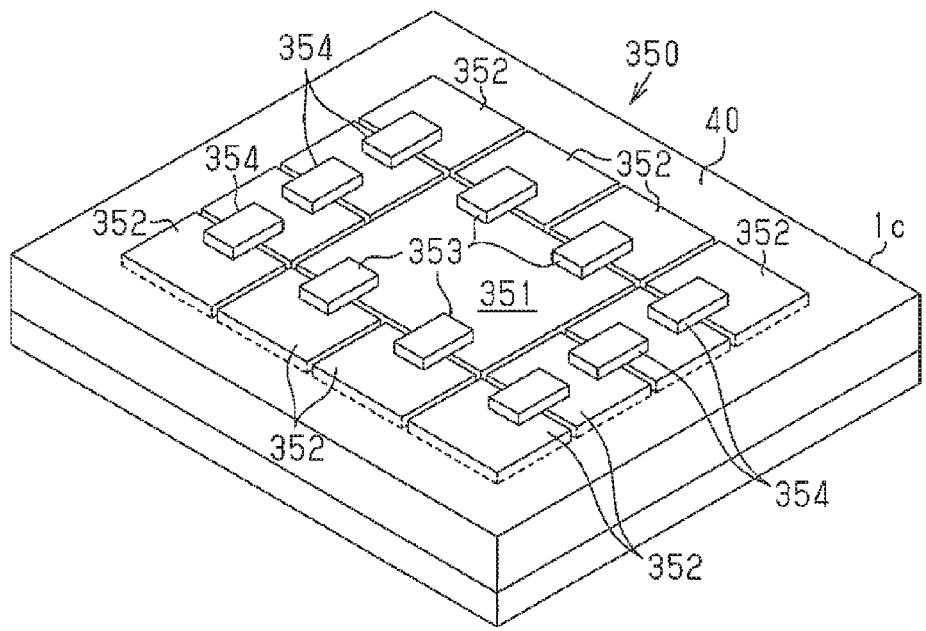
FIG. 14A is a perspective view illustrating a semiconductor device in a further modified example.

FIG. 14A illustrates a semiconductor device 1c in a further modified example. As illustrated in FIG. 14A, a reinforcement plate 350 includes a first base 351 and second bases 352. The first base 351 is located at the center of the semiconductor device 1c. The second bases 352 are smaller than the first base 351 and surround the first base 351.

Figure 14B:
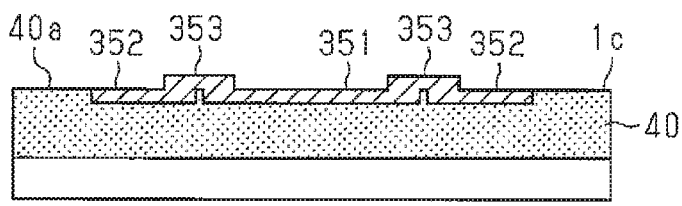
FIG. 14B is a partial cross-sectional view of FIG. 14A.

Referring to FIG. 14B, the first base 351 and the second bases 352 are embedded in the encapsulation resin 40. The reinforcement plate 350 further includes first heat dissipation portions 353 and second heat dissipation portions 354. Each first heat dissipation portion 353 connects the first base 351 and one of the second bases 352 that are adjacent to the first base 351. Accordingly, each first heat dissipation portion 353 lies on the upper surface of the first base 351, the upper surface of the corresponding second base 352, and the upper surface 40a of the encapsulation resin 40 between the first base 351 and the second base 352. Further, each first heat dissipation portion 353 is formed integrally with the first base 351 and the corresponding second base 352. In other words, the first heat dissipation portion 353 connects the first base 351 and the second base 352.

In the same manner, as illustrated in FIG. 14A, each second heat dissipation portion 354 connects two adjacent ones of the second bases 352. In the present example, a plurality of (here, four) second bases 352 are arranged along a straight line and connected by three heat dissipation portions 354.

The number of heat dissipation portions connecting two adjacent bases is adjusted to control the force applied to the encapsulation resin 40 by the reinforcement plate 350 when the temperature changes. Thus, the arrangement of the bases 351 and 352 and the connection locations of the heat dissipation portions 353 and 354 control the degree of deformation of the encapsulation resin 40 and, ultimately, the semiconductor device 1c. That is, the warping of the semiconductor device 1c may be controlled with the structure of the reinforcement plate 350.

In the above embodiments, the reinforcement plates may each be fixed by an adhesive or the like.

Figure 15:
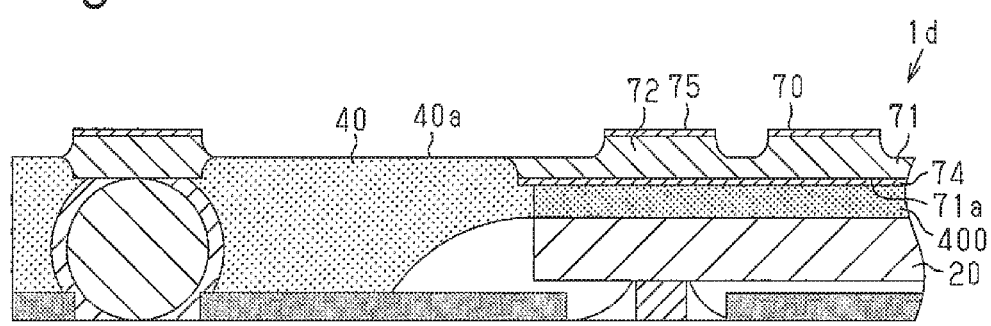
FIG. 15 is a partial cross-sectional view of a semiconductor device in a modified example.

FIG. 15 illustrates a semiconductor device 1d of a modified example. The semiconductor device 1d includes an adhesive 400 between the semiconductor chip 20 and the reinforcement plate 70 (base 71). The reinforcement plate 70 is fixed to the upper surface of the semiconductor chip 20 by the adhesive 400. The adhesive 400 restricts delamination of the reinforcement plate 70. The use of an adhesive 400 having high thermal conductivity further improves the heat dissipation performance. The adhesive 400 may further include, for example, thermal interface material (TIM). The thermal interface material may be a substance having high thermal conductivity such as indium (In), silicone (or hydrocarbon) grease, metal filler, or graphite.

In FIG. 15, the rough-surface plating layer 74 is formed on the lower surface 71a of the base 71. However, the rough-surface plating layer 74 may be omitted. The reinforcement plate 70 of FIG. 15 is one example, and the reinforcement plate of each of the above modified examples may be fixed to the semiconductor chip 20 by the adhesive 400.

In each of the above embodiments, a plurality of electronic components may be mounted on the upper surface of the wiring substrate 10. Further, one or more electronic components may be mounted on the lower surface of the wiring substrate 10.

In each of the above embodiments, the insulation layer 15 illustrated in FIG. 1A may be omitted. Further, the gaps between the wiring patterns of the wiring layer 14 may be embedded with the protective insulation layer 17.

In each of the above embodiments and modified examples, the protective insulation layer 17 may be a solder resist layer.

In each of the above embodiments, the structure (number of wiring layers and number of insulation layers) of the wiring substrate 10 may be changed.

Clause

This disclosure further encompasses the following embodiment.

1. A method for manufacturing a semiconductor device, the method including:

forming, on an upper surface of a wiring substrate, a connection pad and a component pad;

connecting a connection member to the connection pad;

mounting an electronic component on the component pad;

etching a metal plate to reduce the metal plate in thickness and form a first pad and a base that project from one surface of the thinned metal plate;

arranging the thinned metal plate above the wiring substrate and connecting the first pad to the connection member;

forming an encapsulation resin between the wiring substrate and the thinned metal plate to encapsulate the electronic component and the connection member and embed the first pad and the base in the encapsulation resin; and etching the thinned metal plate to expose a portion of an upper surface of the encapsulation resin and form a second pad and a heat dissipation portion, wherein the second pad is formed integrally with the first pad and includes an external device connection surface located at a higher position than the upper surface of the encapsulation resin; and the heat dissipation portion is formed integrally with the base and includes an upper surface located at a higher position than the upper surface of the encapsulation resin.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device comprising:
   a wiring substrate including an upper surface on which a component pad and a connection pad are formed;
   an electronic component connected to the component pad;
   a conductive connection member connected to the connection pad;
   an encapsulation resin that encapsulates the electronic component and the connection member and covers the upper surface of the wiring substrate;
   a wiring unit that includes a first pad and a second pad, wherein the first pad is embedded in the encapsulation resin and electrically connected to the connection member, and the second pad includes an external device connection surface located at a higher position than an upper surface of the encapsulation resin; and
   a reinforcement plate including a base and a heat dissipation portion, wherein the base is plate-like and embedded in the encapsulation resin, and the heat dissipation portion includes an upper surface located at a higher position than the upper surface of the encapsulation resin;
   wherein the first pad and the second pad are formed integrally from the same metal,
   the base and the heat dissipation portion are formed integrally from the same metal, and
   the first pad and the base each include a side surface that is curved so that the curved side surface widens outwardly toward the upper surface of the encapsulation resin.

2. The semiconductor device according to claim 1, wherein the heat dissipation portion is one of a plurality of heat dissipation portions arranged in a matrix array on the base.

3. The semiconductor device according to claim 1, wherein the heat dissipation portion extends in a horizontal direction from an end of the base on the upper surface of the encapsulation resin.

4. The semiconductor device according to claim 1, wherein:
   the reinforcement plate includes a plurality of bases embedded in the encapsulation resin; and
   the bases include
      a first base that is free from the heat dissipation portion, and
      a second base that is formed integrally with the heat dissipation portion.

5. The semiconductor device according to claim 1, wherein:
   the reinforcement plate includes a plurality of bases embedded in the encapsulation resin; and the heat dissipation portion connects two adjacent ones of the bases.

6. The semiconductor device according to claim 1, wherein the base includes a lower surface connected to an upper surface of the electronic component by a thermally conductive adhesive.

7. The semiconductor device according to claim 1, wherein the base includes a lower surface on which a rough-surface plating layer is formed.

8. The semiconductor device according to claim 1, further comprising an external device connected to the external device connection surface.

* * * * *